United States Patent
Stefanski et al.

(10) Patent No.: US 10,209,688 B2
(45) Date of Patent: Feb. 19, 2019

(54) SMART THERMOSTAT ROBUST AGAINST ADVERSE EFFECTS FROM INTERNAL HEAT-GENERATING COMPONENTS

(71) Applicant: Google LLC, Mountain View, CA (US)

(72) Inventors: John Stefanski, Palo Alto, CA (US); Vivek Goyal, San Francisco, CA (US); Orville Buenaventura, San Bruno, CA (US); Alexander Schoenen, Portland, OR (US); Mark Stefanski, Palo Alto, CA (US)

(73) Assignee: Google LLC, Mountain View, CA (US)

( * ) Notice: Subject to any disclaimer, the term of this patent is extended or adjusted under 35 U.S.C. 154(b) by 544 days.

(21) Appl. No.: 14/836,744

(22) Filed: Aug. 26, 2015

(65) Prior Publication Data
US 2017/0059190 A1 Mar. 2, 2017

(51) Int. Cl.
| | |
|---|---|
| *G05D 23/19* | (2006.01) |
| *G05B 15/02* | (2006.01) |
| *F24F 11/46* | (2018.01) |
| *G05D 23/01* | (2006.01) |
| *G01K 1/00* | (2006.01) |
| *H05K 5/00* | (2006.01) |

(52) U.S. Cl.
CPC .............. *G05B 15/02* (2013.01); *F24F 11/46* (2018.01); *G01K 1/00* (2013.01); *G05D 23/015* (2013.01); *G05D 23/193* (2013.01); *G05D 23/1931* (2013.01); *H05K 5/00* (2013.01)

(58) Field of Classification Search
CPC ........ F24F 11/49; F24F 11/88; G05D 23/015; G05D 23/193
See application file for complete search history.

(56) References Cited

U.S. PATENT DOCUMENTS

| | | | |
|---|---|---|---|
| 2013/0099008 A1* | 4/2013 | Aljabari | G05D 23/1932 236/1 C |
| 2014/0324232 A1* | 10/2014 | Modi | F24F 11/0086 700/278 |

* cited by examiner

*Primary Examiner* — Cheung Lee
(74) *Attorney, Agent, or Firm* — Kilpatrick Townsend & Stockton LLP

(57) ABSTRACT

A thermostat may include a plurality of heat-generating components; a plurality of first temperature sensors, each of the plurality of first temperature sensors being disposed next to a corresponding one of the plurality of heat-generating components; a second temperature sensor that is disposed away from the plurality of heat-generating components; and a memory device storing a coefficient matrix. The thermostat may also include one or more processors that combine a plurality of inputs to calculate an ambient temperature for an enclosure in which the thermostat is installed, the plurality of inputs including readings from the plurality of first temperature sensors, readings from the second temperature sensor, and the coefficient matrix.

20 Claims, 23 Drawing Sheets

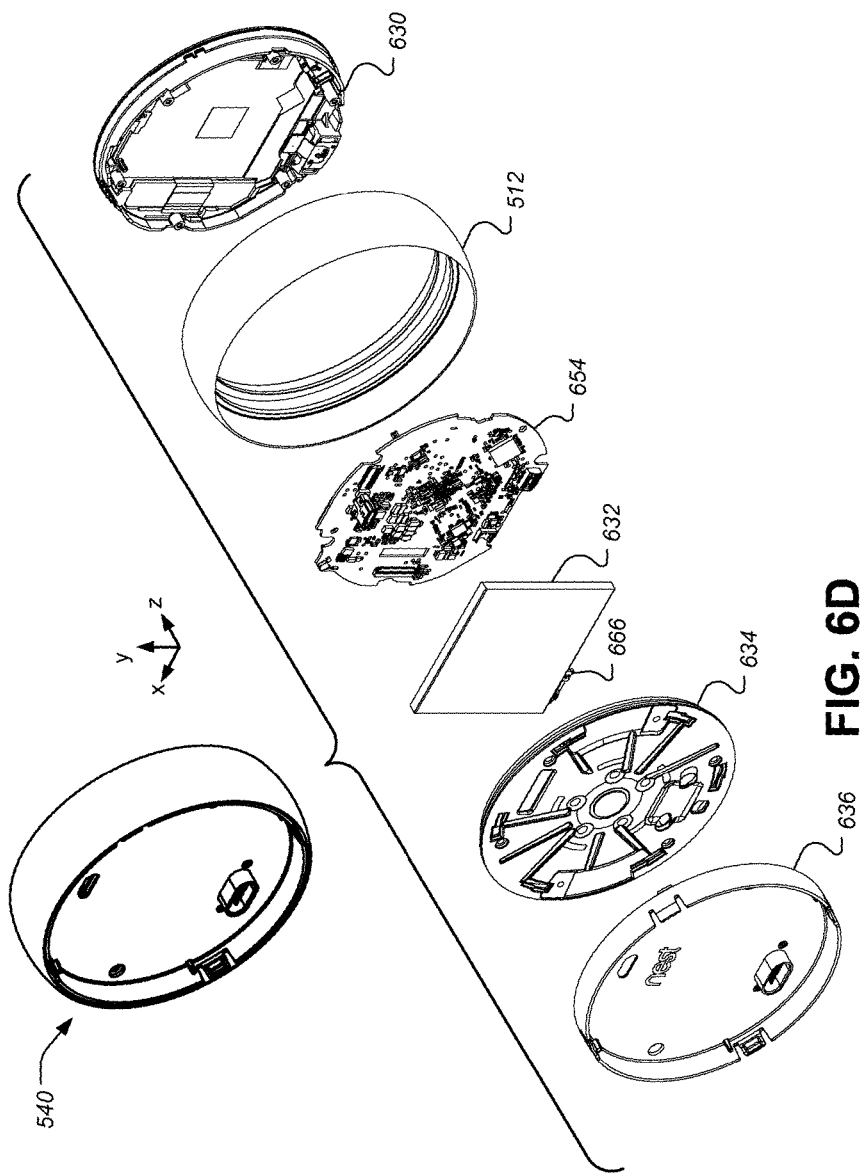

SMART THERMOSTAT ROBUST AGAINST ADVERSE EFFECTS FROM INTERNAL HEAT-GENERATING COMPONENTS

TECHNICAL FIELD

This patent specification relates to systems, methods, and related computer program products for the monitoring and control of energy-consuming systems or other resource-consuming systems. More particularly, this patent specification relates to monitoring and recoverable protection of thermostat circuitry.

BACKGROUND

Digital electronic thermostats have been used for years to regulate temperatures within enclosures, such as homes, office buildings, warehouses, and so forth. These digital electronic thermostats typically employ digital integrated circuits that control the flow of electric power to a Heating, Ventilation, and Air Conditioning (HVAC) system. Digital electronic circuits may include switching elements, rectifiers, and/or microprocessors. In some digital electronic thermostats, excessive internal heat may be generated when digital electronic components are in an active, operating state. The generation of internal heat can interfere with the accurate measurement of ambient temperature within the enclosure as required for accurate temperature regulation. Heat generated by digital electronics may cause inaccuracies in the ambient temperature measurement. These inaccuracies can affect the maintenance of a stable temperature within the enclosure.

BRIEF SUMMARY

In some embodiments, a thermostat may include a plurality of heat-generating components and a plurality of first temperature sensors. Each of the plurality of first temperature sensors may be disposed next to a corresponding one of the plurality of heat-generating components. The thermostat may also include a second temperature sensor that is disposed away from the plurality of heat-generating components and a memory device storing a coefficient matrix. The thermostat may additionally include one or more processors that combine a plurality of inputs to calculate an ambient temperature for an enclosure in which the thermostat is installed. The plurality of inputs may include readings from the plurality of first temperature sensors, readings from the second temperature sensor, and the coefficient matrix.

In some embodiments, a method of determining an ambient temperature in an enclosure while compensating for internal heating effects of a thermostat may include operating a plurality of heat-generating components within the thermostat and generating readings from a plurality of first temperature sensors. Each of the plurality of first temperature sensors may be disposed next to a corresponding one of the plurality of heat-generating components. The method may also include generating readings from a second temperature sensor that is disposed away from the plurality of heat-generating components, and storing a coefficient matrix in a memory device. The method may additionally include combining a plurality of inputs to calculate an ambient temperature for an enclosure in which the thermostat is installed. The plurality of inputs may include readings from the plurality of first temperature sensors, readings from the second temperature sensor, and the coefficient matrix.

In some embodiments, a computer-readable medium comprising instructions that, when executed by one-or more processors on a thermostat, cause the one or more processors to perform operations including operating a plurality of heat-generating components within the thermostat and receiving readings from a plurality of first temperature sensors. Each of the plurality of first temperature sensors may be disposed next to a corresponding one of the plurality of heat-generating components. The operations may also include receiving readings from a second temperature sensor that is disposed away from the plurality of heat-generating components, and storing a coefficient matrix in a memory device. The operations may additionally include combining a plurality of inputs to calculate an ambient temperature for an enclosure in which the thermostat is installed. The plurality of inputs may also include readings from the plurality of first temperature sensors, readings from the second temperature sensor, and the coefficient matrix.

Some embodiments may include one or more of the following features in any combination and without limitation. The one or more processors may include a microprocessor that executes a time-to-temperature algorithm. The plurality of inputs may further include a fraction of time that the microprocessor operates in a wake state. The plurality of first temperature sensors may include a plurality of thermistors. The thermostat may include a housing, where the plurality of heat-generating components and the plurality of first temperature sensors are disposed inside the housing. The housing may include a front portion, and where the second temperature sensor may be disposed next to the front portion of the housing. The plurality of heat-generating components may include a wireless communication chip. The coefficient matrix may characterize how much of each of the plurality of first temperature sensors and the second temperature sensor are weighted when calculating the ambient temperature. The coefficient matrix may be received from a remotely located thermostat management server. The coefficient matrix may be generated using data from thermostats from a plurality of different enclosures. The coefficient matrix may be further generated by minimizing a mean-squared error between true ambient temperature readings calculated ambient temperature readings on a set of training data received from the thermostats from the plurality of different enclosures. The coefficient matrix may be further generated by minimizing a quadratic total variation as a smoothness metric. Combining a plurality of inputs to calculate an ambient temperature may include aggregating a current contribution from the plurality of inputs with a contribution from the plurality of inputs at previous time intervals. The plurality of heat-generating components may include a 6LowPan wireless communication chip. The plurality of heat-generating may include a chip that powers a user interface. The one or more processors may include a microprocessor that executes a time-to-temperature algorithm. The plurality of inputs may further include a fraction of time that the microprocessor operates in a wake state. The thermostat may include power-stealing circuitry that charges a power-storage device, the power-storage device providing power to the heat-generating components when the heat-generating components are active.

BRIEF DESCRIPTION OF THE DRAWINGS

FIG. 6C-6D illustrate exploded front and rear perspective views, respectively, of a head unit with respect to its primary components, according to some embodiments.

DETAILED DESCRIPTION OF THE INVENTION

Figure 1:
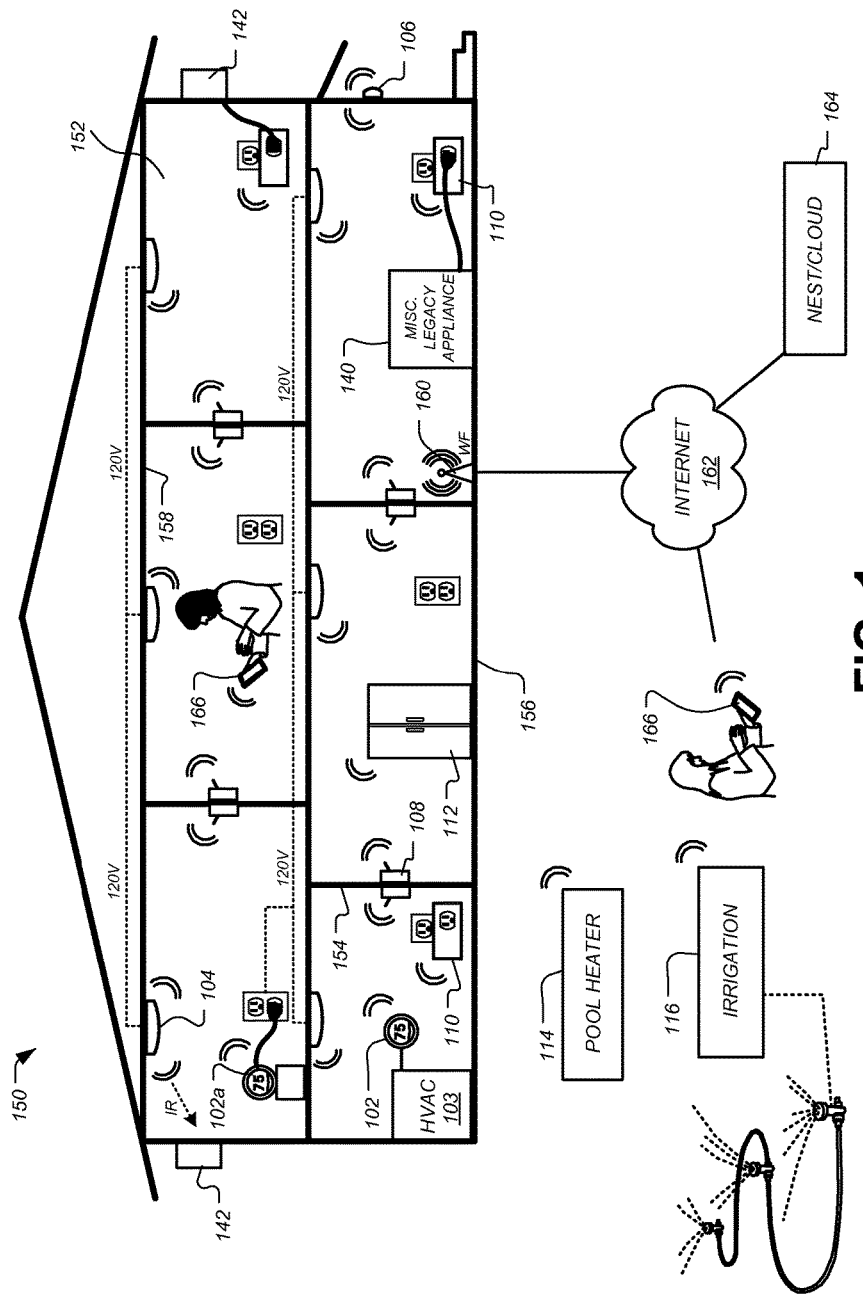
FIG. 1 illustrates an example of a smart home environment within which one or more of the devices, methods, systems, services, and/or computer program products described further herein can be applicable.

The subject matter of this patent specification relates to the subject matter of the following commonly assigned applications, each of which is incorporated by reference herein: U.S. Ser. No. 13/835,321 filed on May 15, 2013 entitled "HVAC Controller Configurations that Compensate for Heat Caused by Direct Sunlight"; and U.S. Ser. No. 13/871,734 filed on Apr. 26, 2013 entitled "Facilitating Ambient Temperature Measurement Accuracy in an HVAC Controller Having Internal Heat-Generating Components".

The subject matter of this patent specification also relates to the subject matter of the following commonly assigned applications, filed on the same day as the present application, each of which is incorporated by reference herein:

U.S. patent application Ser. No. 14/836,699, filed on Aug. 26, 2015, titled THERMOSTAT WITH MULTIPLE SENSING SYSTEMS INTEGRATED THEREIN, to Stefanski et al.

U.S. patent application Ser. No. 14/836,648, filed on Aug. 26, 2015, titled THERMOSTAT WITH MULTIPLE SENSING SYSTEMS INCLUDING PRESENCE DETECTION SYSTEMS INTEGRATED THEREIN, to Goyal et al.

U.S. patent application Ser. No. 14/836,568, filed on Aug. 26, 2015, titled AUTOMATED DISPLAY ADJUSTMENTS FOR SMART-HOME DEVICE BASED ON VIEWER LOCATION OR OTHER SENSED VIEWER-RELATED PARAMETERS, to Goyal et al.

U.S. patent application Ser. No. 14/836,744, filed on Aug. 26, 2015, titled SMART THERMOSTAT ROBUST AGAINST ADVERSE EFFECTS FROM INTERNAL HEAT-GENERATING COMPONENTS, to Stefanski et al.

U.S. patent application Ser. No. 14/836,660, filed on Aug. 26, 2015, titled THERMOSTAT ELECTRONIC DISPLAY AND LENSING ELEMENT THEREFOR, to Giustina.

U.S. patent application Ser. No. 14/836,631, filed on Aug. 26, 2015, titled ROTATION DETECTION FOR RING-SHAPED USER INPUT MEMBER OF SMART-HOME DEVICE, to Stefanski et al.

U.S. patent application Ser. No. 14/836,595, filed on Aug. 26, 2015, titled USER INTERFACE MEMBER FOR ELECTRONIC DEVICE, to Giustina et al.

U.S. patent application Ser. No. 14/836,323, filed on Aug. 26, 2015, titled INTEGRATED ANTENNA SYSTEM AND RELATED COMPONENTS MANAGEMENT FOR A SMART THERMOSTAT, to Honjo et al.

The above-referenced patent applications are collectively referenced herein as "the commonly assigned incorporated applications."

Described herein are embodiments for measuring an environmental condition while compensating for effects on the environmental condition generated by a measurement device itself. Environmental condition sensors are placed next to components that affect the environmental condition such that the local effect of these components can be measured. These effects can be combined with other sensors that are designed to measure the environmental condition in the surrounding area in locations that are less affected by these components that affect the environmental condition. Other operational variables associated with the measurement device can be also incorporated into the measurements, such as components duties cycles and power consumption. Measurements are stored over time and combined with a coefficient matrix to generate an accurate calculation of the environmental condition. The coefficient matrix can be generated using training data that, in some cases, can be sourced from measurement devices in many different locations and indifferent enclosures.

This general inventive concept can be illustrated herein using exemplary smart home devices, specifically a thermostat. A thermostat is designed to measure ambient temperature within an enclosure. However, some electronic components inside a thermostat housing can generate heat in and of themselves. This internal heat generation can affect the accuracy of temperature sensor measurements that are meant to measure the ambient temperature of the surrounding enclosure, not the internal temperature of the thermostat. In order to compensate for heat-generating components, temperature sensors can be placed in close proximity to the heat-generating components within the thermostat. Temperature measurements from these temperature sensors can be combined with heat measurements from a second set of temperature sensors that are somewhat isolated from the heat-generating components. These more isolated temperature sensors should generally track the ambient temperature in the room, while the first temperature sensors next to the heat-generating components will closely track the temperature of the heat-generating components. Other characteristics of the thermostat, such as a duty cycle of a main processor, backlit display, or Wi-Fi chip can also be incorporated into the algorithm. These inputs can be combined with a set of calculated coefficients stored in a coefficient matrix to calculate an estimate of the ambient temperature in the room, referred to herein as a "compensated temperature." The values of the coefficient matrix represent the weight, or effect, that each of the inputs will have on the final temperature reading. A weighted sum of inputs can then be used to calculate the ambient temperature. In some embodiments, an immediate set of inputs received at the time the calculation takes place can be combined with weighted inputs from the past. For example, one embodiment may use a current input set in combination with the previous 20 input sets to determine the ambient temperature. This provides a smoothing effect to the compensated temperature calculation.

This disclosure will be divided into three main sections. The first section will describe the smart home environment where measurement devices such as thermostats, hazard detectors, and/or the like may be installed to monitor environmental conditions within an enclosure. The second section will briefly describe the basic architecture of a smart thermostat in which the embodiments described herein may be implemented. The third section will describe specific hardware and software components of the smart thermostat designed to compensate for heat-generating effects of a measurement device.

The Smart-Home Environment

A detailed description of the inventive body of work is provided herein. While several embodiments are described, it should be understood that the inventive body of work is not limited to any one embodiment, but instead encompasses numerous alternatives, modifications, and equivalents. In addition, while numerous specific details are set forth in the following description in order to provide a thorough understanding of the inventive body of work, some embodiments can be practiced without some or all of these details. Moreover, for the purpose of clarity, certain technical material that is known in the related art has not been described in detail in order to avoid unnecessarily obscuring the inventive body of work.

As used herein the term "HVAC" includes systems providing both heating and cooling, heating only, cooling only, as well as systems that provide other occupant comfort and/or conditioning functionality such as humidification, dehumidification and ventilation.

As used herein the terms power "harvesting," "sharing" and "stealing" when referring to HVAC thermostats all refer to thermostats that are designed to derive power from the power transformer through the equipment load without using a direct or common wire source directly from the transformer.

As used herein the term "residential" when referring to an HVAC system means a type of HVAC system that is suitable to heat, cool and/or otherwise condition the interior of a building that is primarily used as a single family dwelling. An example of a cooling system that would be considered residential would have a cooling capacity of less than about 5 tons of refrigeration (1 ton of refrigeration=12,000 Btu/h).

As used herein the term "light commercial" when referring to an HVAC system means a type of HVAC system that is suitable to heat, cool and/or otherwise condition the interior of a building that is primarily used for commercial purposes, but is of a size and construction that a residential HVAC system is considered suitable. An example of a cooling system that would be considered residential would have a cooling capacity of less than about 5 tons of refrigeration.

As used herein the term "thermostat" means a device or system for regulating parameters such as temperature and/or humidity within at least a part of an enclosure. The term "thermostat" may include a control unit for a heating and/or cooling system or a component part of a heater or air conditioner. As used herein the term "thermostat" can also refer generally to a versatile sensing and control unit (VSCU unit) that is configured and adapted to provide sophisticated, customized, energy-saving HVAC control functionality while at the same time being visually appealing, non-intimidating, elegant to behold, and delightfully easy to use.

FIG. 1 illustrates an example of a smart home environment within which one or more of the devices, methods, systems, services, and/or computer program products described further herein can be applicable. The depicted smart home environment includes a structure 150, which can include, e.g., a house, office building, garage, or mobile home. It will be appreciated that devices can also be integrated into a smart home environment that does not include an entire structure 150, such as an apartment, condominium, or office space. Further, the smart home environment can control and/or be coupled to devices outside of the actual structure 150. Indeed, several devices in the smart home environment need not physically be within the structure 150 at all. For example, a device controlling a pool heater or irrigation system can be located outside of the structure 150.

The depicted structure 150 includes a plurality of rooms 152, separated at least partly from each other via walls 154. The walls 154 can include interior walls or exterior walls. Each room can further include a floor 156 and a ceiling 158. Devices can be mounted on, integrated with and/or supported by a wall 154, floor or ceiling.

The smart home depicted in FIG. 1 includes a plurality of devices, including intelligent, multi-sensing, network-connected devices that can integrate seamlessly with each other and/or with cloud-based server systems to provide any of a variety of useful smart home objectives. One, more or each of the devices illustrated in the smart home environment and/or in the figure can include one or more sensors, a user interface, a power supply, a communications component, a modularity unit and intelligent software as described herein. Examples of devices are shown in FIG. 1.

An intelligent, multi-sensing, network-connected thermostat 102 can detect ambient climate characteristics (e.g., temperature and/or humidity) and control a heating, ventilation and air-conditioning (HVAC) system 103. One or more intelligent, network-connected, multi-sensing hazard detection units 104 can detect the presence of a hazardous substance and/or a hazardous condition in the home environment (e.g., smoke, fire, or carbon monoxide). One or more intelligent, multi-sensing, network-connected entry-way interface devices 106, which can be termed a "smart doorbell", can detect a person's approach to or departure from a location, control audible functionality, announce a person's approach or departure via audio or visual means, or control settings on a security system (e.g., to activate or deactivate the security system).

Each of a plurality of intelligent, multi-sensing, network-connected wall light switches 108 can detect ambient lighting conditions, detect room-occupancy states and control a power and/or dim state of one or more lights. In some instances, light switches 108 can further or alternatively control a power state or speed of a fan, such as a ceiling fan. Each of a plurality of intelligent, multi-sensing, network-connected wall plug interfaces 110 can detect occupancy of a room or enclosure and control supply of power to one or more wall plugs (e.g., such that power is not supplied to the plug if nobody is at home). The smart home may further include a plurality of intelligent, multi-sensing, network-connected appliances 112, such as refrigerators, stoves and/or ovens, televisions, washers, dryers, lights (inside and/or outside the structure 150), stereos, intercom systems, garage-door openers, floor fans, ceiling fans, whole-house fans, wall air conditioners, pool heaters 114, irrigation systems 116, security systems (including security system components such as cameras, motion detectors and window/door sensors), and so forth. While descriptions of FIG. 1 can identify specific sensors and functionalities associated with specific devices, it will be appreciated that any of a variety of sensors and functionalities (such as those described throughout the specification) can be integrated into the device.

In addition to containing processing and sensing capabilities, each of the devices 102, 104, 106, 108, 110, 112, 114 and 116 can be capable of data communications and information sharing with any other of the devices 102, 104, 106, 108, 110, 112, 114 and 116, as well as to any cloud server or any other device that is network-connected anywhere in the world. The devices can send and receive communications via any of a variety of custom or standard wireless protocols (Wi-Fi, ZigBee, 6LoWPAN, Thread, Bluetooth, BLE, HomeKit Accessory Protocol (HAP), Weave, etc.) and/or any of a variety of custom or standard wired protocols (CAT6 Ethernet, HomePlug, etc.). The wall plug interfaces 110 can serve as wireless or wired repeaters, and/or can function as bridges between (i) devices plugged into AC outlets and communicating using Homeplug or other power line protocol, and (ii) devices that not plugged into AC outlets.

For example, a first device can communicate with a second device via a wireless router 160. A device can further communicate with remote devices via a connection to a network, such as the Internet 162. Through the Internet 162, the device can communicate with a central server or a cloud-computing system 164. The central server or cloud-computing system 164 can be associated with a manufacturer, support entity or service provider associated with the device. For one embodiment, a user may be able to contact customer support using a device itself rather than needing to use other communication means such as a telephone or Internet-connected computer. Further, software updates can be automatically sent from the central server or cloud-computing system 164 to devices (e.g., when available, when purchased, or at routine intervals).

By virtue of network connectivity, one or more of the smart-home devices of FIG. 1 can further allow a user to interact with the device even if the user is not proximate to the device. For example, a user can communicate with a device using a computer (e.g., a desktop computer, laptop computer, or tablet) or other portable electronic device (e.g., a smartphone). A webpage or app can be configured to receive communications from the user and control the device based on the communications and/or to present information about the device's operation to the user. For example, the user can view a current setpoint temperature for a device and adjust it using a computer. The user can be in the structure during this remote communication or outside the structure.

The smart home also can include a variety of non-communicating legacy appliances 140, such as old conventional washer/dryers, refrigerators, and the like which can be controlled, albeit coarsely (ON/OFF), by virtue of the wall plug interfaces 110. The smart home can further include a variety of partially communicating legacy appliances 142, such as IR-controlled wall air conditioners or other IR-controlled devices, which can be controlled by IR signals provided by the hazard detection units 104 or the light switches 108.

Figure 2:
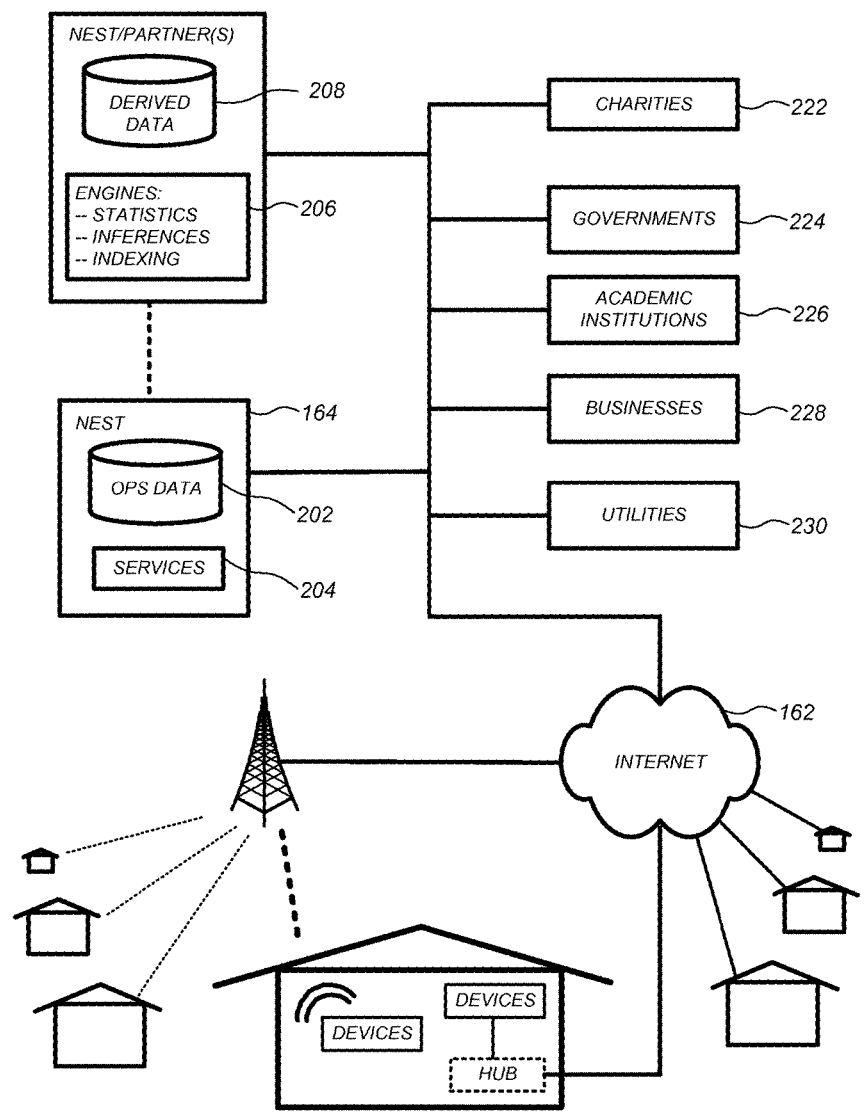
FIG. 2 illustrates a network-level view of an extensible devices and services platform with which the smart home of FIG. 1 can be integrated, according to some embodiments.

FIG. 2 illustrates a network-level view of an extensible devices and services platform with which the smart home of FIG. 1 can be integrated, according to some embodiments. Each of the intelligent, network-connected devices from FIG. 1 can communicate with one or more remote central servers or cloud computing systems 164. The communication can be enabled by establishing connection to the Internet 162 either directly (for example, using 3G/4G connectivity to a wireless carrier), though a hubbed network (which can be scheme ranging from a simple wireless router, for example, up to and including an intelligent, dedicated whole-home control node), or through any combination thereof.

The central server or cloud-computing system 164 can collect operation data 202 from the smart home devices. For example, the devices can routinely transmit operation data or can transmit operation data in specific instances (e.g., when requesting customer support). The central server or cloud-computing architecture 164 can further provide one or more services 204. The services 204 can include, e.g., software update, customer support, sensor data collection/logging, remote access, remote or distributed control, or use suggestions (e.g., based on collected operation data 204 to improve performance, reduce utility cost, etc.). Data associated with the services 204 can be stored at the central server or cloud-computing system 164 and the central server or cloud-computing system 164 can retrieve and transmit the data at an appropriate time (e.g., at regular intervals, upon receiving request from a user, etc.).

One salient feature of the described extensible devices and services platform, as illustrated in FIG. 2, is a processing engines 206, which can be concentrated at a single server or distributed among several different computing entities without limitation. Processing engines 206 can include engines configured to receive data from a set of devices (e.g., via the Internet or a hubbed network), to index the data, to analyze the data and/or to generate statistics based on the analysis or as part of the analysis. The analyzed data can be stored as derived data 208. Results of the analysis or statistics can thereafter be transmitted back to a device providing ops data used to derive the results, to other devices, to a server providing a webpage to a user of the device, or to other non-device entities. For example, use statistics, use statistics relative to use of other devices, use patterns, and/or statistics summarizing sensor readings can be transmitted. The results or statistics can be provided via the Internet 162. In this manner, processing engines 206 can be configured and programmed to derive a variety of useful information from the operational data obtained from the smart home. A single server can include one or more engines.

The derived data can be highly beneficial at a variety of different granularities for a variety of useful purposes, ranging from explicit programmed control of the devices on a per-home, per-neighborhood, or per-region basis (for example, demand-response programs for electrical utilities), to the generation of inferential abstractions that can assist on a per-home basis (for example, an inference can be drawn that the homeowner has left for vacation and so security detection equipment can be put on heightened sensitivity), to the generation of statistics and associated inferential abstractions that can be used for government or charitable purposes. For example, processing engines 206 can generate statistics about device usage across a population of devices and send the statistics to device users, service providers or other entities (e.g., that have requested or may have provided monetary compensation for the statistics). As specific illustrations, statistics can be transmitted to charities 222, governmental entities 224 (e.g., the Food and Drug Administration or the Environmental Protection Agency), academic institutions 226 (e.g., university researchers), businesses 228 (e.g., providing device warranties or service to related equipment), or utility companies 230. These entities can use the data to form programs to reduce energy usage, to preemptively service faulty equipment, to prepare for high service demands, to track past service performance, etc., or to perform any of a variety of beneficial functions or tasks now known or hereinafter developed.

Figure 3:
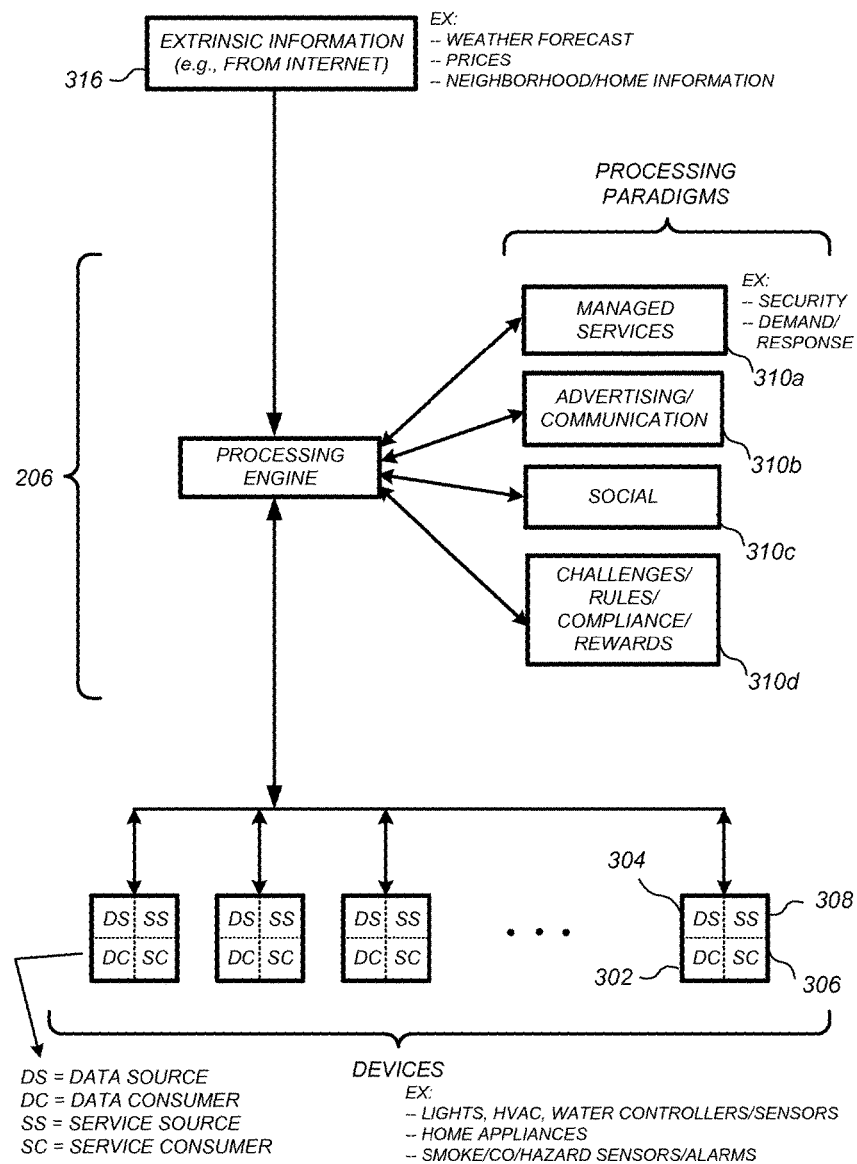
FIG. 3 illustrates an abstracted functional view of the extensible devices and services platform of FIG. 2, according to some embodiments.

FIG. 3 illustrates an abstracted functional view of the extensible devices and services platform of FIG. 2, with particular reference to the processing engine 206 as well as the devices of the smart home. Even though the devices situated in the smart home will have an endless variety of different individual capabilities and limitations, they can all be thought of as sharing common characteristics in that each of them is a data consumer 302 (DC), a data source 304 (DS), a services consumer 306 (SC), and a services source 308 (SS). Advantageously, in addition to providing the essential control information needed for the devices to achieve their local and immediate objectives, the extensible devices and services platform can also be configured to harness the large amount of data that is flowing out of these devices. In addition to enhancing or optimizing the actual operation of the devices themselves with respect to their immediate functions, the extensible devices and services platform can also be directed to "repurposing" that data in a variety of automated, extensible, flexible, and/or scalable ways to achieve a variety of useful objectives. These objectives may be predefined or adaptively identified based on, e.g., usage patterns, device efficiency, and/or user input (e.g., requesting specific functionality).

For example, FIG. 3 shows processing engine 206 as including a number of paradigms 310. Processing engine 206 can include a managed services paradigm 310a that monitors and manages primary or secondary device functions. The device functions can include ensuring proper operation of a device given user inputs, estimating that (e.g., and responding to) an intruder is or is attempting to be in a dwelling, detecting a failure of equipment coupled to the device (e.g., a light bulb having burned out), implementing or otherwise responding to energy demand response events, or alerting a user of a current or predicted future event or characteristic. Processing engine 206 can further include an advertising/communication paradigm 310b that estimates characteristics (e.g., demographic information), desires and/or products of interest of a user based on device usage. Services, promotions, products or upgrades can then be offered or automatically provided to the user. Processing engine 206 can further include a social paradigm 310c that uses information from a social network, provides information to a social network (for example, based on device usage), processes data associated with user and/or device interactions with the social network platform. For example, a user's status as reported to their trusted contacts on the social network could be updated to indicate when they are home based on light detection, security system inactivation or device usage detectors. As another example, a user may be able to share device-usage statistics with other users. Processing engine 206 can include a challenges/rules/compliance/rewards paradigm 310d that informs a user of challenges, rules, compliance regulations and/or rewards and/or that uses operation data to determine whether a challenge has been met, a rule or regulation has been complied with and/or a reward has been earned. The challenges, rules or regulations can relate to efforts to conserve energy, to live safely (e.g., reducing exposure to toxins or carcinogens), to conserve money and/or equipment life, to improve health, etc.

Processing engine can integrate or otherwise utilize extrinsic information 316 from extrinsic sources to improve the functioning of one or more processing paradigms. Extrinsic information 316 can be used to interpret operational data received from a device, to determine a characteristic of the environment near the device (e.g., outside a structure that the device is enclosed in), to determine services or products available to the user, to identify a social network or social-network information, to determine contact information of entities (e.g., public-service entities such as an emergency-response team, the police or a hospital) near the device, etc., to identify statistical or environmental conditions, trends or other information associated with a home or neighborhood, and so forth.

An extraordinary range and variety of benefits can be brought about by, and fit within the scope of, the described extensible devices and services platform, ranging from the ordinary to the profound. Thus, in one "ordinary" example, each bedroom of the smart home can be provided with a smoke/fire/CO alarm that includes an occupancy sensor, wherein the occupancy sensor is also capable of inferring (e.g., by virtue of motion detection, facial recognition, audible sound patterns, etc.) whether the occupant is asleep or awake. If a serious fire event is sensed, the remote security/monitoring service or fire department is advised of how many occupants there are in each bedroom, and whether those occupants are still asleep (or immobile) or whether they have properly evacuated the bedroom. While this is, of course, a very advantageous capability accommodated by the described extensible devices and services platform, there can be substantially more "profound" examples that can truly illustrate the potential of a larger "intelligence" that can be made available. By way of perhaps a more "profound" example, the same data bedroom occupancy data that is being used for fire safety can also be "repurposed" by the processing engine 206 in the context of a social paradigm of neighborhood child development and education. Thus, for example, the same bedroom occupancy and motion data discussed in the "ordinary" example can be collected and made available for processing (properly anonymized) in which the sleep patterns of schoolchildren in a particular ZIP code can be identified and tracked. Localized variations in the sleeping patterns of the schoolchildren may be identified and correlated, for example, to different nutrition programs in local schools.

Figure 4:
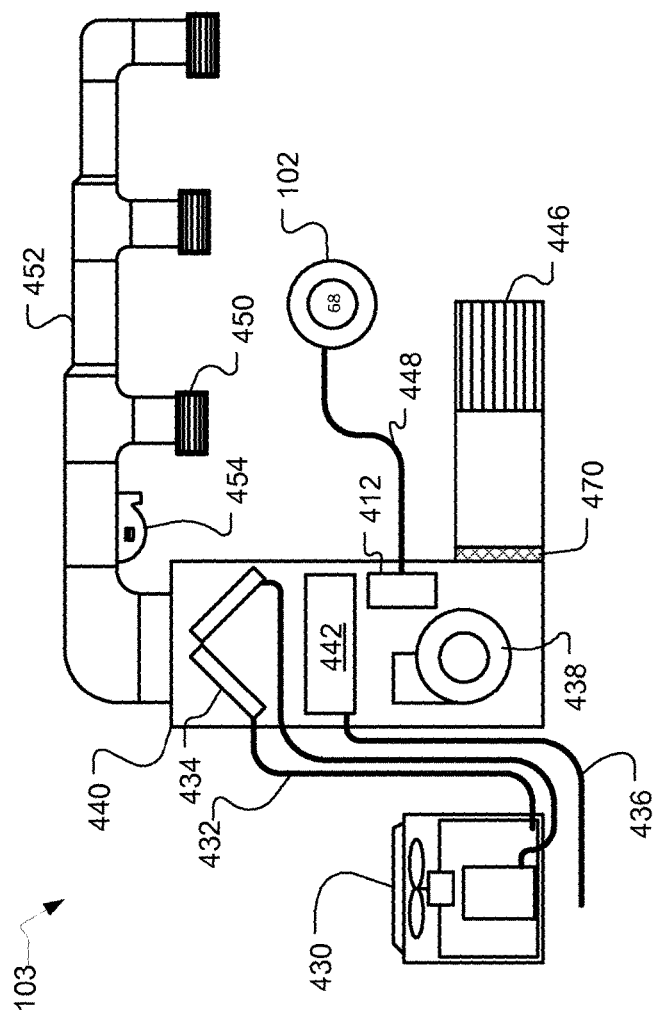
FIG. 4 illustrates a schematic diagram of an HVAC system, according to some embodiments.

FIG. 4 is a schematic diagram of an HVAC system, according to some embodiments. HVAC system 103 provides heating, cooling, ventilation, and/or air handling for an enclosure, such as structure 150 depicted in FIG. 1. System 103 depicts a forced air type heating and cooling system, although according to other embodiments, other types of HVAC systems could be used such as radiant heat based systems, heat-pump based systems, and others.

For carrying out the heating function, heating coils or elements 442 within air handler 440 provide a source of heat using electricity or gas via line 436. Cool air is drawn from the enclosure via return air duct 446 through filter 470, using fan 438 and is heated through heating coils or elements 442. The heated air flows back into the enclosure at one or more locations via supply air duct system 452 and supply air registers such as register 450. In cooling, an outside compressor 430 passes a refrigerant gas through a set of heat exchanger coils and then through an expansion valve. The gas then goes through line 432 to the cooling coils or evaporator coils 434 in the air handler 440 where it expands, cools and cools the air being circulated via fan 438. A humidifier 454 may optionally be included in various embodiments that returns moisture to the air before it passes through duct system 452. Although not shown in FIG. 4, alternate embodiments of HVAC system 103 may have other functionality such as venting air to and from the outside, one or more dampers to control airflow within the duct system 452 and an emergency heating unit. Overall operation of HVAC system 103 is selectively actuated by control electronics 412 communicating with thermostat 102 over control wires 448.

The Smart-Home Thermostat

Figure 5A:
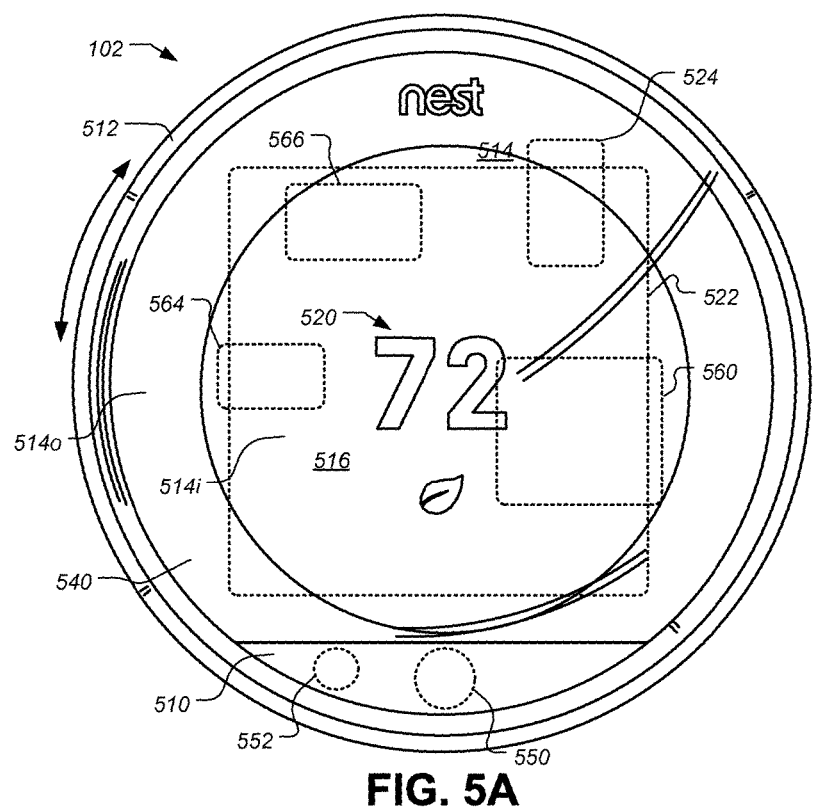
FIG. 5A-5D illustrate a thermostat having a visually pleasing, smooth, sleek and rounded exterior appearance while at the same time including one or more sensors for detecting occupancy and/or users, according to some embodiments.
Figure 5B:
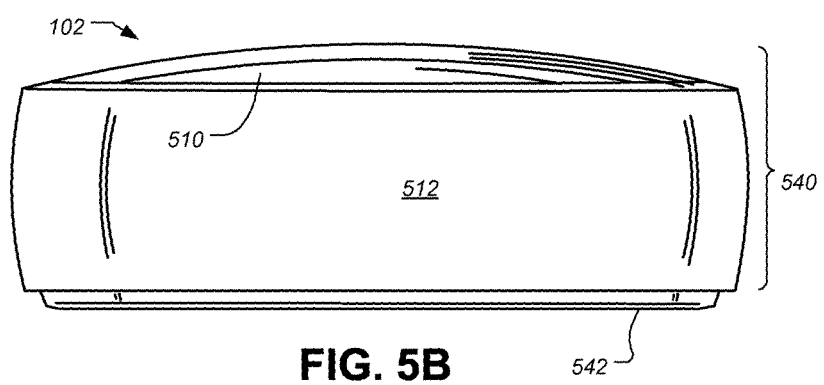
Figure 5C:
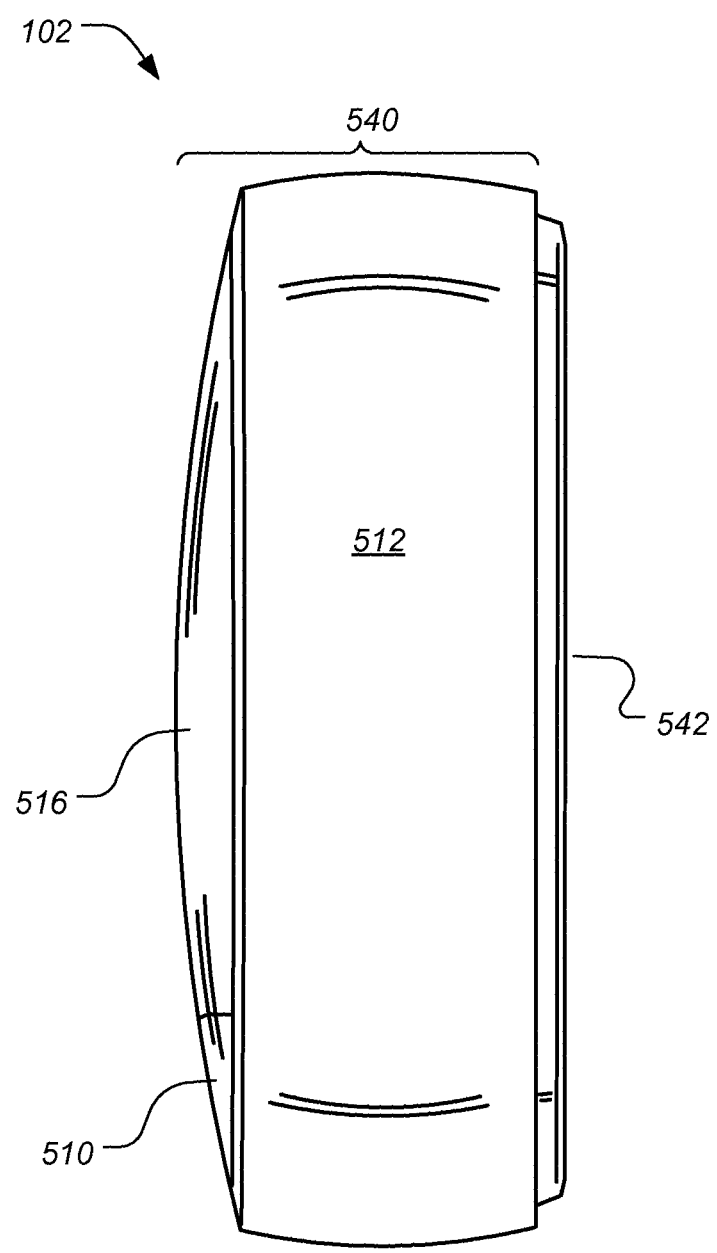
Figure 5D:
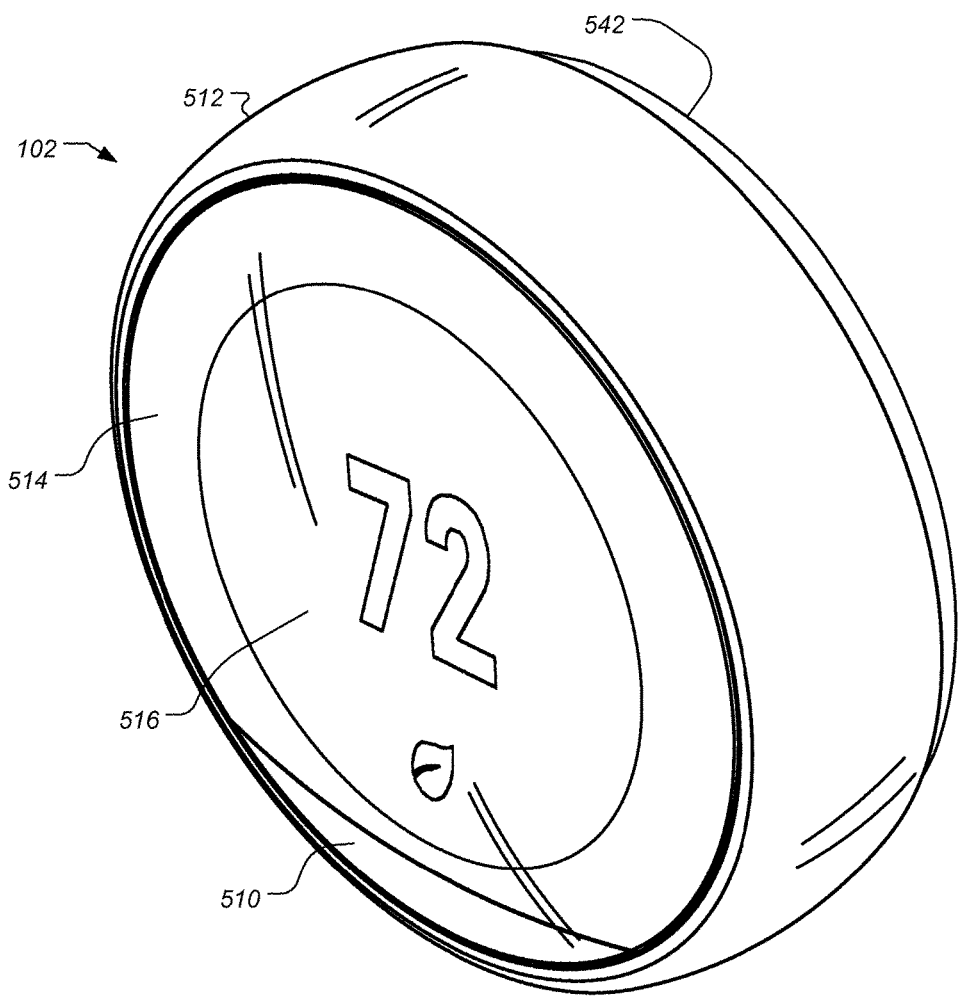

FIGS. 5A-5D illustrate a thermostat having a rounded exterior appearance and including one or more sensors for detecting environmental conditions, such as occupancy and/or users, temperature, ambient light, humidity, and so forth. FIG. 5A is front view, FIG. 5B is a bottom elevation, FIG. 5C is a right side elevation, and FIG. 5D is perspective view of thermostat 102. Unlike many prior art thermostats, thermostat 102 has a simple and elegant design. Moreover, user interaction with thermostat 102 is facilitated and greatly enhanced over known conventional thermostats. The thermostat 102 includes control circuitry and is electrically connected to an HVAC system 103, such as is shown in FIGS. 1-4. Thermostat 102 is wall mountable, is circular in shape, and has an outer rotatable ring 512 for receiving user input. Thermostat 102 has a large convex rounded front face lying inside the outer rotatable ring 512. According to some embodiments, thermostat 102 is approximately 84 mm in diameter and protrudes from the wall, when wall mounted, by 30 mm. The outer rotatable ring 512 allows the user to make adjustments, such as selecting a new setpoint temperature. For example, by rotating the outer ring 512 clockwise, the real-time (i.e. currently active) setpoint temperature can be increased, and by rotating the outer ring 512 counter-clockwise, the real-time setpoint temperature can be decreased.

The front face of the thermostat 102 comprises a cover 514 that according to some embodiments is polycarbonate, and a lens 510 having an outer shape that matches the contours of the curved outer front face of the thermostat 102. According to some embodiments, Fresnel lens elements may are formed on the interior surface of the lens 510 such that they are not obviously visible by viewing the exterior of the thermostat 102. Behind the lens 510 is a passive infrared (PIR) sensor 550 for detecting occupancy, a temperature sensor that is thermally coupled to the lens 510, and a multi-channel thermopile for detecting occupancy, user approaches, and motion signatures. The Fresnel lens elements of the lens 510 are made from a high-density polyethylene (HDPE) that has an infrared transmission range appropriate for sensitivity to human bodies. The lens 510 may also include thin sections that allow a near-field proximity sensor 552, such as a multi-channel thermopile, and a temperature sensor to "see-through" the lens 510 with minimal interference from the polyethylene. As shown in FIGS. 5A-5D, the front edge of the outer rotatable ring 512, cover 514, and lens 510 are shaped such that they together form an integrated convex rounded front face that has a common outward arc or spherical shape arcing outward.

Although being formed from a single lens-like piece of material such as polycarbonate, the cover 514 has two different regions or portions including an outer portion 514o and a central portion 514i. According to some embodiments, the cover 514 is darkened around the outer portion 514o, but leaves the central portion 514i visibly clear so as to facilitate viewing of an electronic display 516 disposed underneath. According to some embodiments, the cover 514 acts as a lens that tends to magnify the information being displayed in electronic display 516 to users. According to some embodiments the central electronic display 516 is a dot-matrix layout (i.e. individually addressable) such that arbitrary shapes can be generated. According to some embodiments, electronic display 516 is a backlit, color liquid crystal display (LCD). An example of information displayed on the electronic display 516 is illustrated in FIG. 5A, and includes central numerals 520 that are representative of a current setpoint temperature. The thermostat 102 may be constructed such that the electronic display 516 is at a fixed orientation and does not rotate with the outer rotatable ring 512. For some embodiments, the cover 514 and lens 510 also remain at a fixed orientation and do not rotate with the outer ring 512. In alternative embodiments, the cover 514 and/or the lens 510 can rotate with the outer rotatable ring 512. According to one embodiment in which the diameter of the thermostat 102 is about 84 mm, the diameter of the electronic display 516 is about 54 mm. According to some embodiments the curved shape of the front surface of thermostat 102, which is made up of the cover 514, the lens 510 and the front facing portion of the ring 512, is spherical, and matches a sphere having a radius of between 100 mm and 180 mm. According to some embodiments, the radius of the spherical shape of the thermostat front is about 156 mm.

Motion sensing with PIR sensor 550 as well as other techniques can be used in the detection and/or prediction of occupancy. According to some embodiments, occupancy information is used in generating an effective and efficient scheduled program. A second near-field proximity sensor 552 is also provided to detect an approaching user. The near-field proximity sensor 552 can be used to detect proximity in the range of up to 10-15 feet. the PIR sensor 550 and/or the near-field proximity sensor 552 can detect user presence such that the thermostat 102 can initiate "waking up" and/or providing adaptive screen displays that are based on user motion/position when the user is approaching the thermostat and prior to the user touching the thermostat. Such use of proximity sensing is useful for enhancing the user experience by being "ready" for interaction as soon as, or very soon after the user is ready to interact with the thermostat. Further, the wake-up-on-proximity functionality also allows for energy savings within the thermostat by "sleeping" when no user interaction is taking place our about to take place.

According to some embodiments, the thermostat 102 may be controlled by at least two types of user input, the first being a rotation of the outer rotatable ring 512 as shown in FIG. 5A, and the second being an inward push on head unit 540 until an audible and/or tactile "click" occurs. For such embodiments, the head unit 540 is an assembly that includes the outer ring 512, the cover 514, the electronic display 516, and the lens 510. When pressed inwardly by the user, the head unit 540 travels inwardly by a small amount, such as 0.5 mm, against an interior switch (not shown), and then springably travels back out when the inward pressure is released, providing a tactile "click" along with a corresponding audible clicking sound. Thus, for the embodiment of FIGS. 5A-5D, an inward click can be achieved by direct pressing on the outer rotatable ring 512 itself, or by indirect pressing of the outer rotatable ring 512 by virtue of providing inward pressure on the cover 514, the lens 510, or by various combinations thereof. For other embodiments, the thermostat 102 can be mechanically configured such that only the outer ring 512 travels inwardly for the inward click input, while the cover 514 and lens 510 remain motionless.

FIG. 5B and FIG. 5C are bottom and right side elevation views of the thermostat 102. According to some embodiments, the thermostat 102 includes a processing system 560, display driver 564 and a wireless communications system 566. The processing system 560 is adapted to cause the display driver 564 and display 516 to display information to the user, and to receiver user input via the outer rotatable ring 512. The processing system 560, according to some embodiments, is capable of carrying out the governance of the operation of thermostat 102 including various user interface features. The processing system 560 is further programmed and configured to carry out other operations, such as maintaining and updating a thermodynamic model for the enclosure in which the HVAC system is installed. According to some embodiments, a wireless communications system 566 is used to communicate with devices such as personal computers, other thermostats or HVAC system components, smart phones, local home wireless networks, routers, gateways, home appliances, security systems, hazard detectors, remote thermostat management servers, distributed sensors and/or sensor systems, and other components it the modern smart-home environment. Such communications may include peer-to-peer communications, communications through one or more servers located on a private network, or and/or communications through a cloud-based service.

According to some embodiments, the thermostat 102 includes a head unit 540 and a backplate (or wall dock) 542. Head unit 540 of thermostat 102 is slidably mountable onto back plate 542 and slidably detachable therefrom. According to some embodiments the connection of the head unit 540 to backplate 542 can be accomplished using magnets, bayonet, latches and catches, tabs, and/or ribs with matching indentations, or simply friction on mating portions of the head unit 540 and backplate 542. Also shown in FIG. 5A is a rechargeable battery 522 that is recharged using recharging circuitry 524 that uses power from backplate that is either obtained via power harvesting (also referred to as power stealing and/or power sharing) from the HVAC system control circuit (s) or from a common wire, if available. According to some embodiments, the rechargeable battery 522 may include a single cell lithium-ion battery, or a lithium-polymer battery.

Figure 6A:
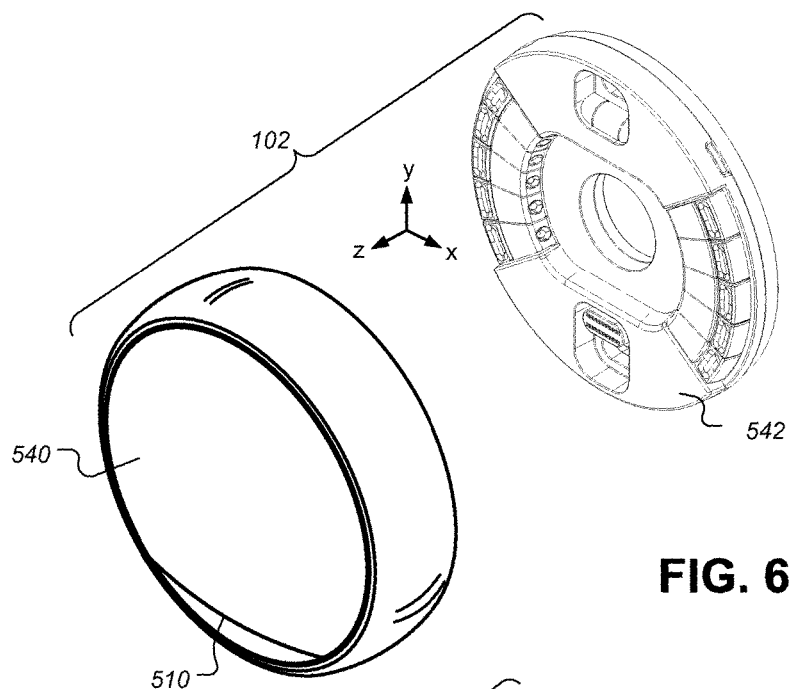
FIG. 6A-6B illustrate exploded front and rear perspective views, respectively, of a thermostat with respect to its two main components, according to some embodiments.
Figure 6B:
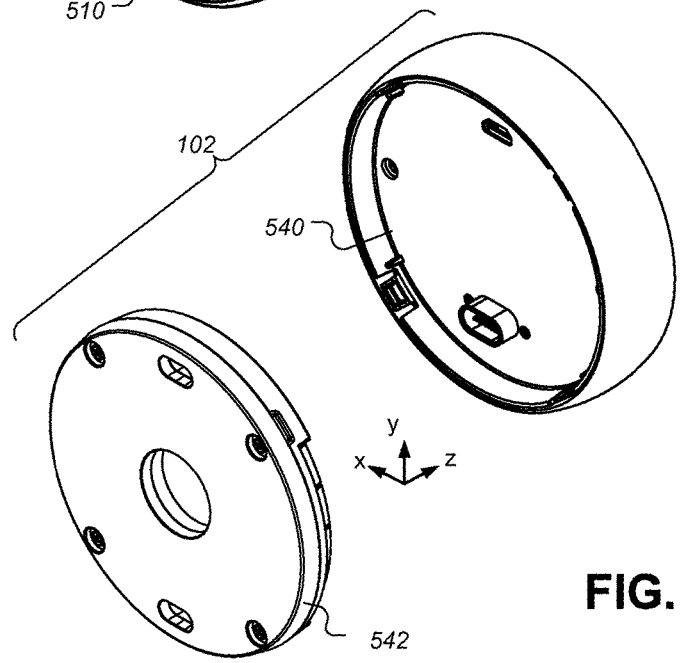

FIGS. 6A-6B illustrate exploded front and rear perspective views, respectively, of the thermostat 102 with respect to its two main components, which are the head unit 540 and the backplate 542. In the drawings shown herein, the "z" direction is outward from the wall, the "y" direction is the toe-to-head direction relative to a walk-up user, and the "x" direction is the user's left-to-right direction.

Figure 6C:
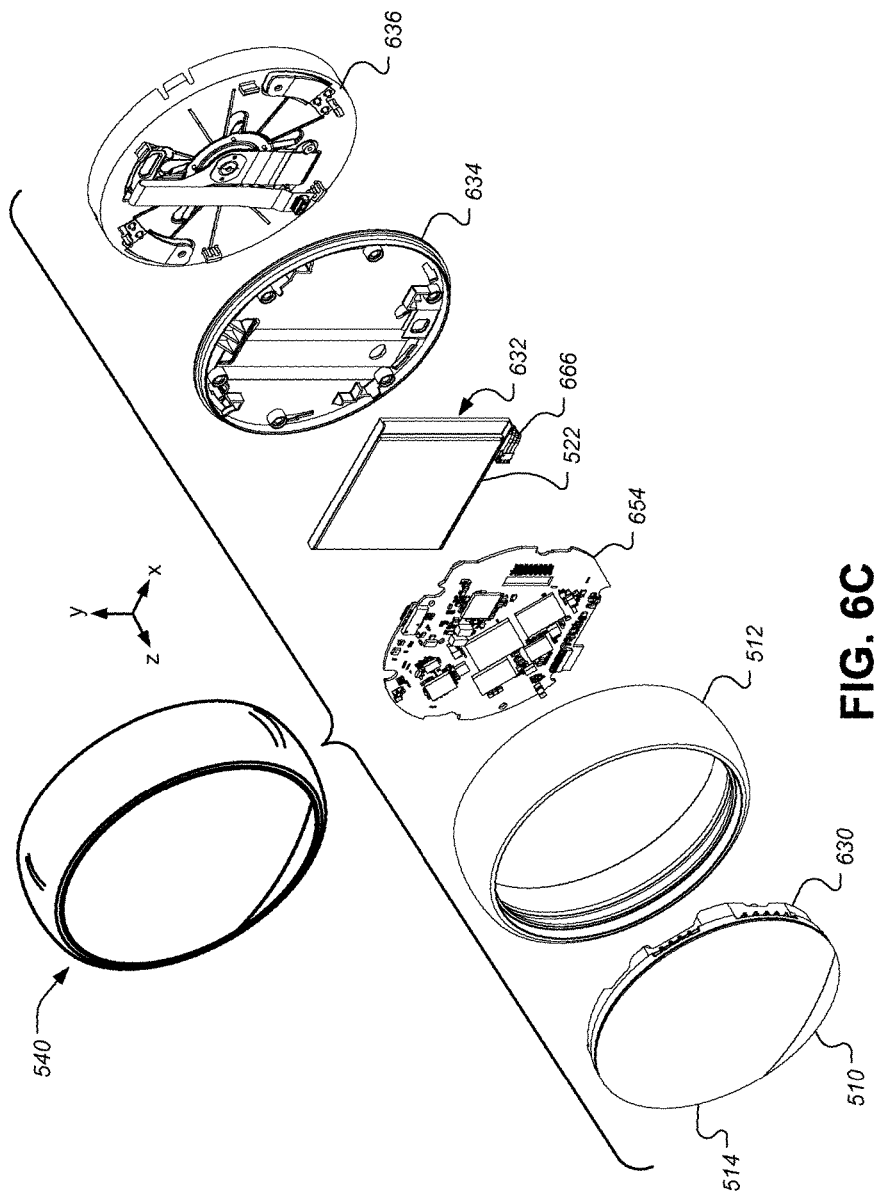

FIGS. 6C-6D illustrate exploded front and rear perspective views, respectively, of the head unit 540 with respect to its primary components. Head unit 540 includes, a back cover 636, a bottom frame 634, a battery assembly 632 with the rechargeable battery 522, a head unit printed circuit board (PCB) 654, the outer rotatable ring 512, the cover 514, and the lens 510. Behind the lens is the display assembly 630, which will be described in relation to FIGS. 6E-6F below. Electrical components on the head unit PCB 654 can connect to electrical components on the back plate 542 by virtue of a plug-type electrical connector on the back cover 636. The head unit PCB 654 is secured to head unit back cover 636 and display assembly 630. The outer rotatable ring 512 is held between a bearing surface on the display assembly 630 and bearing surfaces on the bottom frame 634. Motion of the outer rotatable ring 512 in the z direction is constrained by flat bearing surfaces on the display assembly 630 and bottom frame 634, while motion of the ring in x and y directions are constrained at least in part by circular rounded surfaces on the bottom frame 634. According to some embodiments, the bearing surfaces of the bottom frame 634 and/or the display assembly 630 are greased and/or otherwise lubricated to both smooth and dampen rotational movement for the outer ring 512. The head unit printed PCB 654 may include some or all of processing system 560, display driver 564, wireless communication system 566, and battery recharging circuitry 524 as shown and described with respect to FIG. 5A, as well as one or more additional memory storage components. According to some embodiments, circuitry and components are mounted on both sides of head unit PCB 654. Although not shown, according to some embodiments, shielding can surround circuitry and components on both sides of the head unit PCB 654.

Battery assembly 632 includes a rechargeable battery 522. Battery assembly 632 also includes connecting wires 666, and a battery mounting film that is attached to battery 522 using a strong adhesive and/or the any rear shielding of head unit PCB 654 using a relatively weaker adhesive. According to some embodiments, the battery assembly 632 is user-replaceable.

Figure 6E:
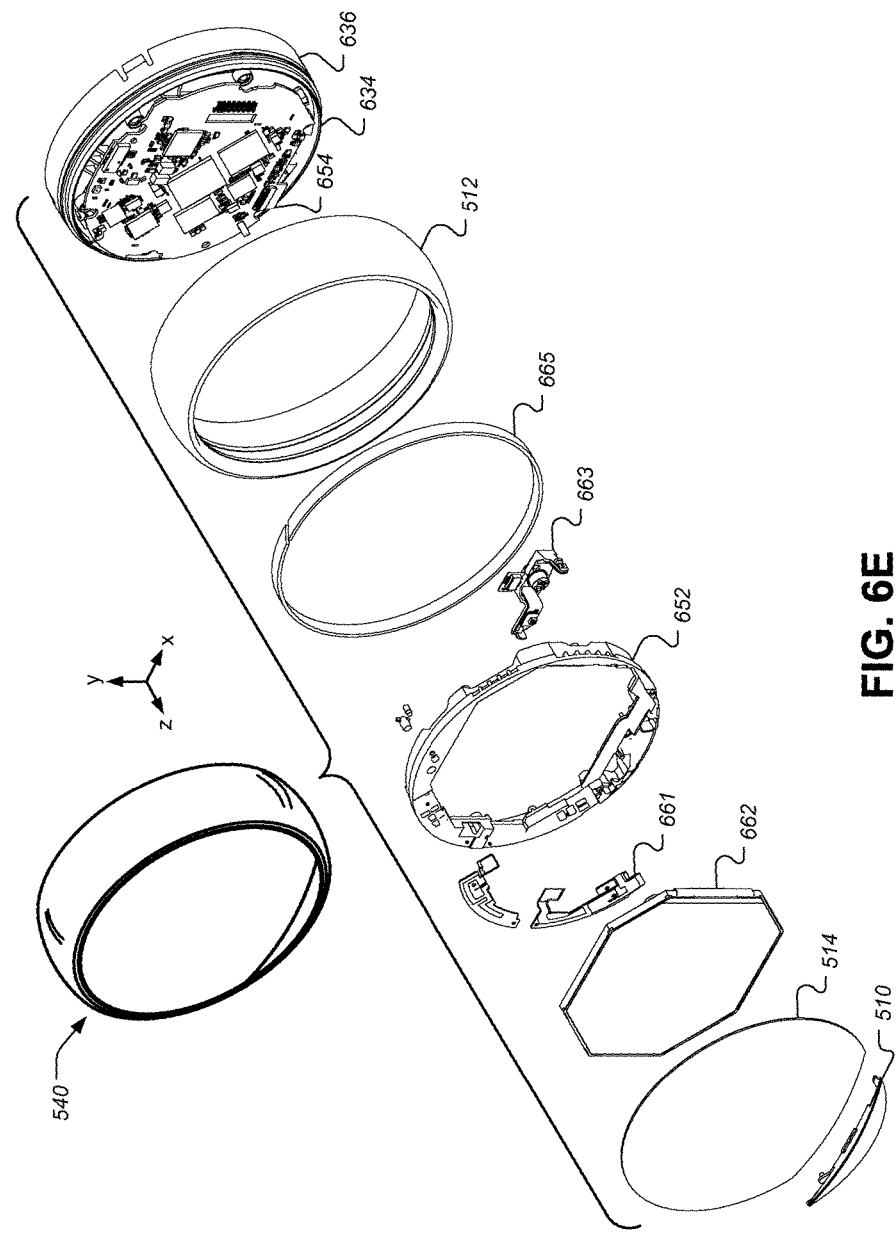
FIG. 6E-6F illustrate exploded front and rear perspective views, respectively, of a head unit display assembly with respect to its primary components, according to some embodiments.
Figure 6F:
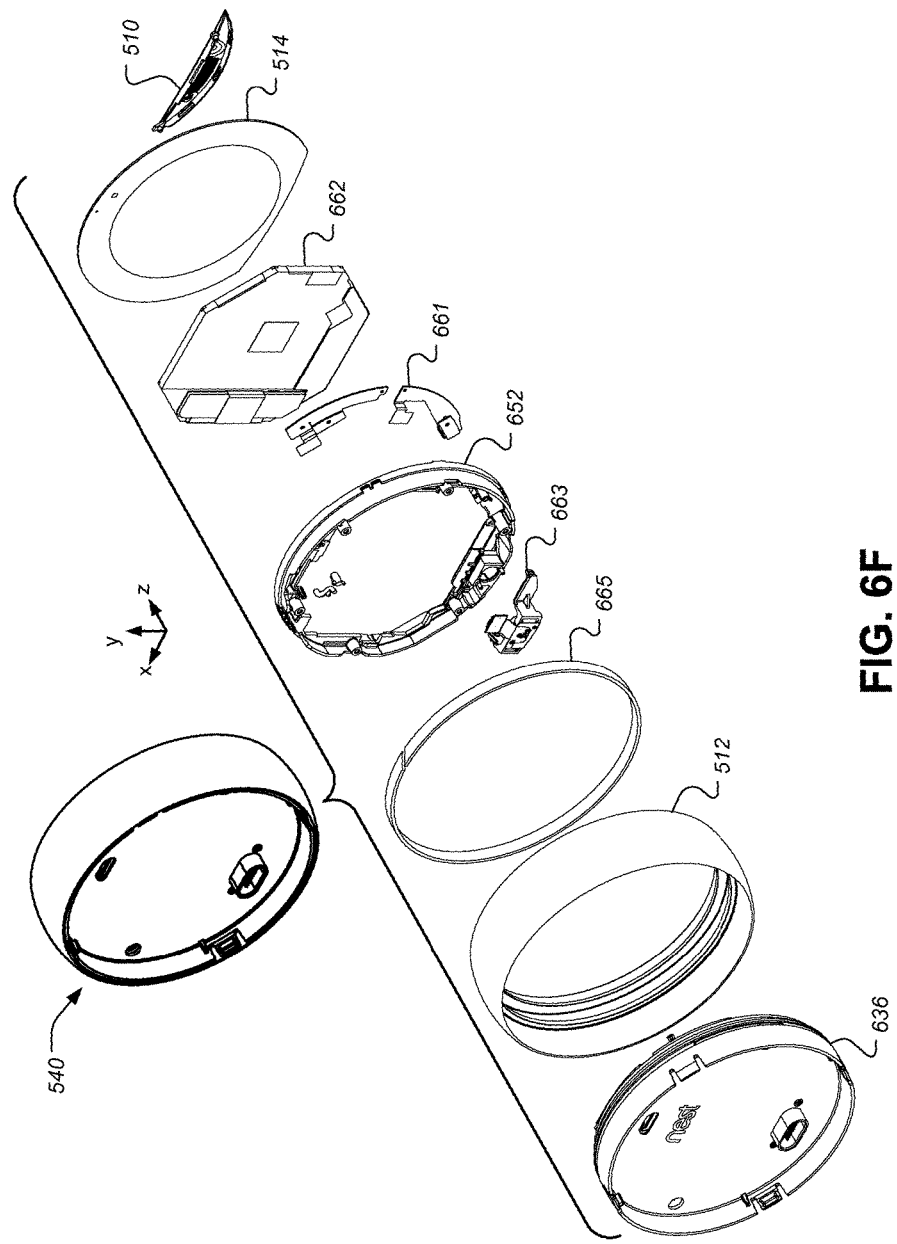

FIGS. 6E-6F illustrate exploded front and rear perspective views, respectively, of the head unit 540 with an exploded view of the display assembly 630. The display assembly 630 comprises the cover 514, the lens 510, an LCD module 662, a pair of RF antennas 661, a head unit top frame 652, a sensor flex assembly 663, and a magnetic ring 665. The sensor flex assembly 663 connects to the head unit PCB 654 using a connector on a flexible PCB. The sensor flex assembly 663 also includes the PIR sensor 550 and the near-field proximity sensor 552. Additionally, the sensor flex assembly 663 may include a temperature sensor IC that is positioned close to the lens 515 so as to accurately measure temperature outside of the thermostat 102 without being overly affected by internal heating of thermostat components. The sensor flex assembly 663 may be comprised of these three sensors, along with a flexible PCB (including the connector for the head unit PCB 654) and a plastic bracket to which the sensors and flexible PCB are mounted. The bracket ensures that the sensor flex assembly 663 is positioned and oriented consistently and correctly with respect to the lens 510. The lens 510 includes two sections that are thinned to approximately 0.3 mm in front of the near-field proximity sensor 552 and the temperature sensor. The lens 510 also includes a section with a Fresnel lens pattern in front of the PIR sensor 550. In some embodiments, additional temperature sensors may be placed throughout the thermostat 102, such as a temperature sensor on the head unit PCB 654 and a temperature sensor on the back plate PCB 680.

The head unit PCB 554 includes a Hall effect sensor that senses rotation of the magnetic ring 665. The magnetic ring 665 is mounted to the inside of the outer rotatable ring 512 using an adhesive such that the outer rotatable ring 512 and the magnetic ring 665 are rotated together. The magnetic ring 665 includes striated sections of alternating magnetic polarity that are diagonally positioned around the magnetic ring 665. The Hall effect sensor senses the alternations between magnetic polarities as the outer ring 512 is rotated. The Hall effect sensor can be controlled by a primary processor, which is a higher powered processor, without excessive power drain implications because the primary processor will invariably be awake already when the user is manually turning the outer rotatable ring 512 to control the user interface. Advantageously, very fast response times can also be provided by the primary processor.

The antennas 661 are mounted to the top surface of the head unit top frame 652. The wireless communications system 566 may include Wi-Fi radios of various frequencies (e.g., 2.4 GHz and 5.0 GHz), along with an IEEE 802.15.4-compliant radio unit for a local-area smart home device network that may include other thermostats, hazard detectors, security system modules, and so forth. The IEEE 802.15.4 unit may use the Thread protocol for achieving such communications. In some embodiments, the wireless communications system 566 may also include a Bluetooth low energy (BLE) radio for communication with user devices.

The processing system 560 may be primarily located on the head unit PCB 654 and may include a primary processor and a secondary processor. The primary processor may be a comparatively high-powered processor, such as the AM3703 chip, or the MCIMX6X3EVK10AB chip from Freescale™, and may be programmed to perform sophisticated thermostat operations, such as time-to-temperature calculations, occupancy determination algorithms, ambient temperature compensation calculations, software updates, wireless transmissions, operation of the display driver 564, and regulation of the recharging circuitry 524. The secondary processor, such as the STM32L chip from ST microelectronics, may be a comparatively low-power processor when compared to the primary processor. The secondary processor may interact with the HVAC system to control a series of FET switches that control the functioning of the HVAC system. The secondary processor may also interface with various sensors in thermostat 102, such as the temperature sensors, a humidity sensor, an ambient light sensor, and/or the like. The secondary processor may also share duties with the primary processor in regulating the recharging circuitry 522 to provide power to all of the electrical systems on board the thermostat 102. Generally, the primary processor will operate in a "sleep" mode until high-power processing operations (e.g., wireless communications, user interface interactions, time-to-temperature calculations, thermal model calculations, etc.) are required, while the secondary processor will operate in an "awake" mode more often than the primary processor in order to monitor environmental sensors and wake the primary processor when needed.

Figures 6G, 6H:
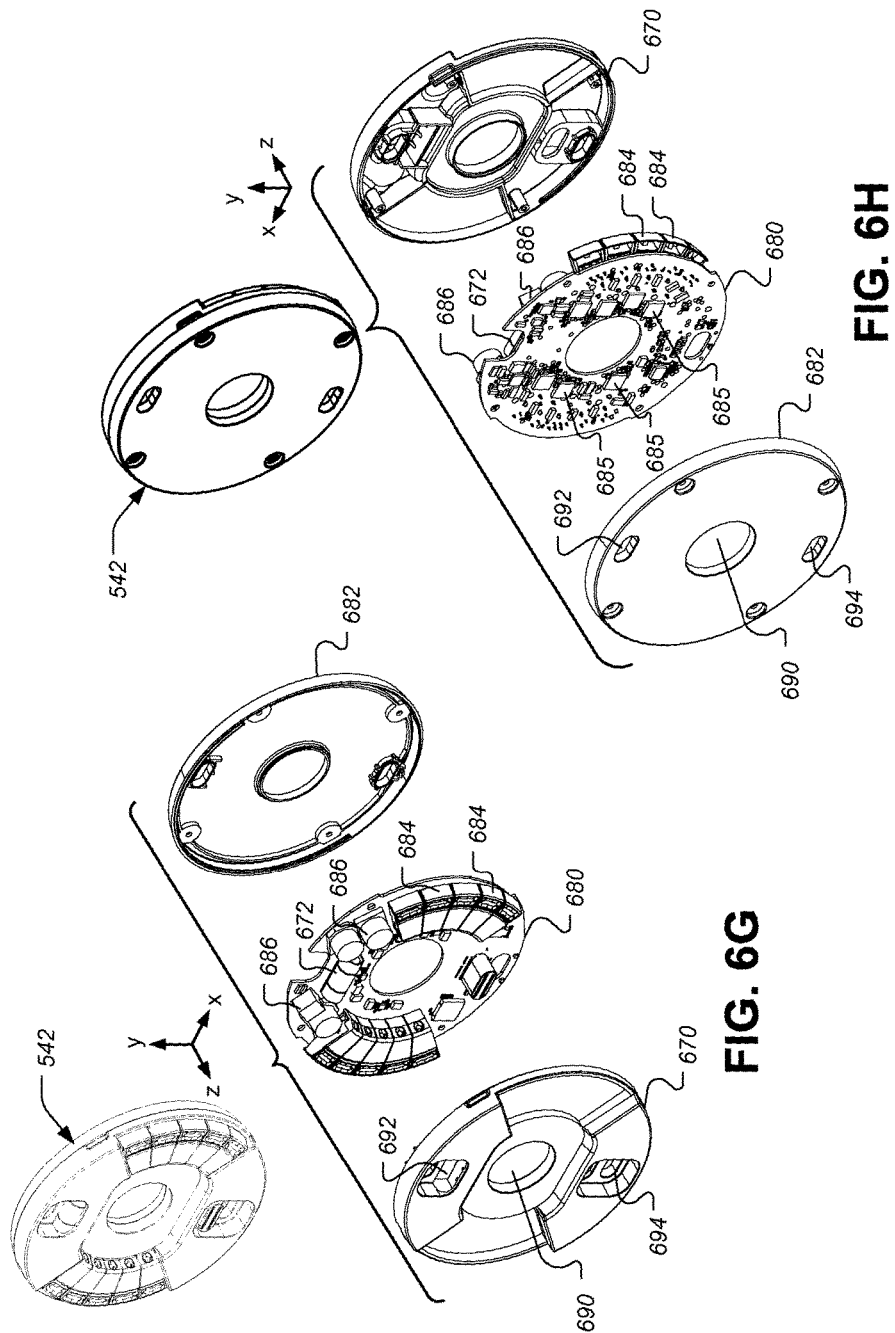
FIG. 6G-6H illustrate exploded front and rear perspective views, respectively, of a back plate unit with respect to its primary components, according to some embodiments.

FIGS. 6G-6H illustrate exploded front and rear perspective views, respectively, of the back plate unit 542 with respect to its primary components, according to some embodiments. Back plate unit 542 comprises a back plate rear plate 682, a back plate PCB 680, and a back plate cover 670. Visible in FIG. 6G are the HVAC wire connectors 684 that include integrated mechanical wire insertion sensing circuitry, and relatively large capacitors 686 that are used by part of the power stealing circuitry that is mounted on the back plate PCB 680. According to some embodiments, backplate 542 includes electronics and a temperature/humidity sensor in housing. Wire connectors 684 are provided to allow for connection to HVAC system wires, which pass though the large central circular opening 690, which is visible in each of the backplate primary components. Also visible in each of the backplate primary components are two mounting holes 692 and 694 for use in fixing the backplate to the wall. Also visible in FIGS. 6G-6H are a bubble level 672 to allow the user to install the thermostat 102 in a level position without additional tools.

The back plate PCB 680 also may include approximately seven custom power isolation ICs 685 that isolate the internal electronics of the thermostat 102 from the relatively high 24 VAC signals of the HVAC system. The power isolation ICs 685 are custom software-resettable fuses that both monitor transient and anomalous voltage/current signals on the HVAC power/return wires and switch off the connection to isolate the thermostat against any dangerous signals that could damage the internal electronics. The power isolation ICs 685 receive command signals encoded in a clock square wave from the processing system 560 to open and close a pair of power FETs for each HVAC return wire in order to activate the corresponding HVAC function (e.g., fan, air-conditioning, heat, heat pump, etc.). A complete description of the power isolation ICs 685 is given in the commonly assigned U.S. patent application Ser. No. 14/591,804 filed on Jan. 7, 2015, which is hereby incorporated herein by reference in its entirety for all purposes.

Figure 7:
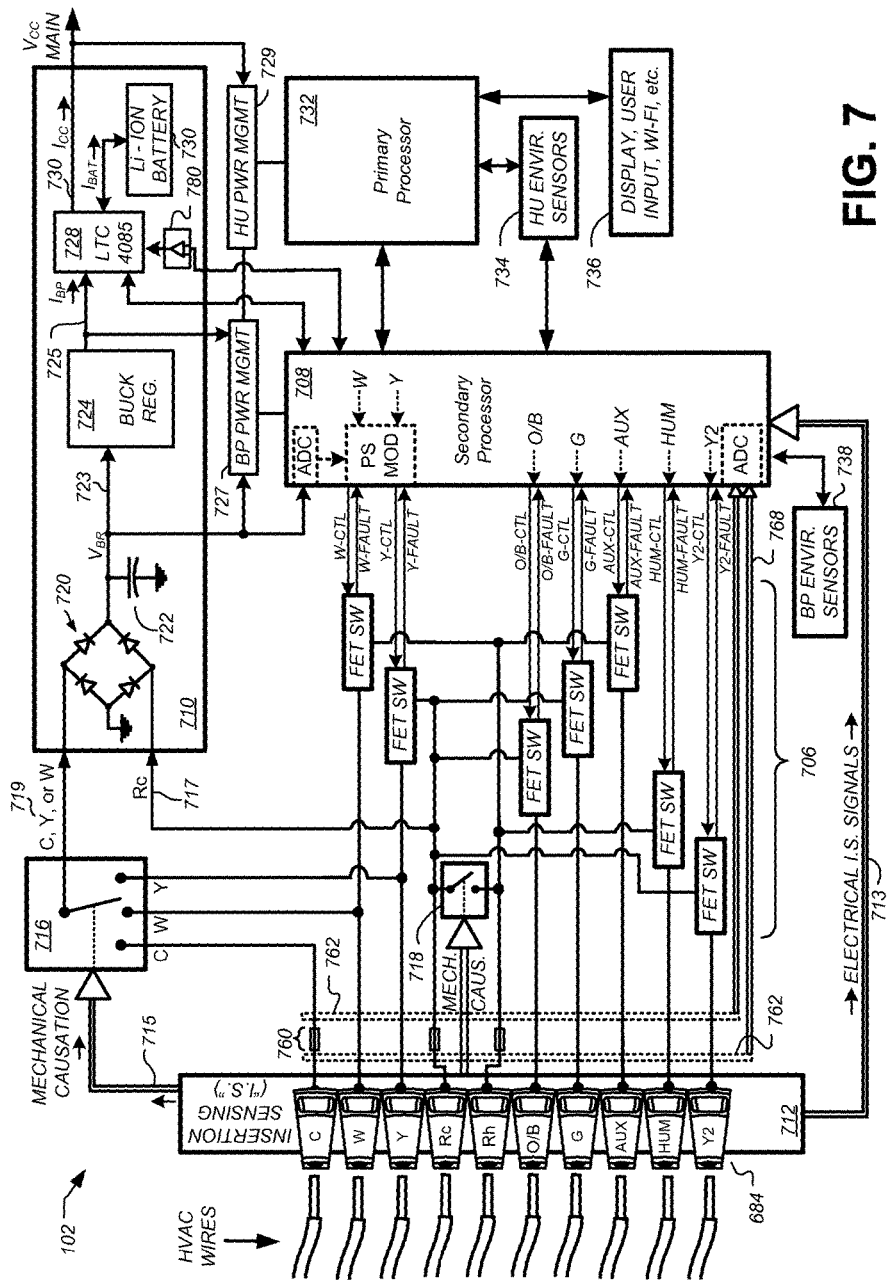
FIG. 7 illustrates a block diagram illustrating circuitry within a thermostat, according to some embodiments.

FIG. 7 illustrates a power management and power harvesting system for a smart thermostat, according to some embodiments. FIG. 7 shows connections to common HVAC wiring, such as a W (heat call relay wire); Y (cooling call relay wire); Y2 (second stage cooling call relay wire); Rh (heat call relay power); Rc (cooling call relay power); G (fan call relay wire); O/B (heat pump call relay wire); AUX (auxiliary call relay wire); HUM (humidifier call relay wire); and C (common wire). As discussed above, the thermostat 102 comprises a plurality of FET switches 706 (such as the power isolation ICs 685 of FIG. 6H above) used for carrying out the essential thermostat operations of connecting or "shorting" one or more selected pairs of HVAC wires together according to the desired HVAC operation. The operation of each of the FET switches 706 is controlled by the secondary processor 708 which can comprise, for example, an STM32L 32-bit ultra-low power ARM-based microprocessor available from ST Microelectronics.

Thermostat 102 further comprises powering circuitry 710 that comprises components contained on both the backplate 542 and head unit 540. Generally speaking, it is the purpose of powering circuitry 710 to extract electrical operating power from the HVAC wires and convert that power into a usable form for the many electrically-driven components of the thermostat 102. Thermostat 102 further comprises insertion sensing components 712 configured to provide automated mechanical and electrical sensing regarding the HVAC wires that are inserted into the thermostat 102. Thermostat 102 further comprises a relatively high-power primary processor 732, such as an AM3703 Sitara ARM microprocessor available from Texas Instruments, that provides the main general governance of the operation of the thermostat 102. Thermostat 102 further comprises environmental sensors 734/738 (e.g., temperature sensors, humidity sensors, active IR motion sensors, passive IR motion sensors, multi-channel thermopiles, ambient visible light sensors, accelerometers, ambient sound sensors, ultrasonic/ infrasonic sound sensors, microwave sensors, GPS sensors, etc.), as well as other components 736 (e.g., electronic display devices and circuitry, user interface devices and circuitry, wired communications circuitry, wireless communications circuitry, etc.) that are operatively coupled to the primary processor 732 and/or secondary processor 708 and collectively configured to provide the functionalities described in the instant disclosure.

The insertion sensing components 712 include a plurality of HVAC wiring connectors 684, each containing an internal springable mechanical assembly that, responsive to the mechanical insertion of a physical wire thereinto, will mechanically cause an opening or closing of one or more dedicated electrical switches associated therewith. With respect to the HVAC wiring connectors 684 that are dedicated to the C, W, Y, Rc, and Rh terminals, those dedicated electrical switches are, in turn, networked together in a manner that yields the results that are illustrated in FIG. 7 by the blocks 716 and 718. The output of block 716, which is provided at a node 719, is dictated solely by virtue of the particular combination of C, W, and Y connectors into which wires have been mechanically inserted in accordance with the following rules: if a wire is inserted into the C connector, then the node 719 becomes the C node regardless of whether there are any wires inserted into the Y or W connectors; if no wire is inserted into the C connector and a wire is inserted into the Y connector, then the node 719 becomes the Y node regardless of whether there is a wire inserted into the W connector; and if no wire is inserted into either of the C or Y connectors, then the node 719 becomes the W node. Block 718 is shown as being coupled to the internal sensing components 712 by virtue of double lines termed "mechanical causation," for the purpose of denoting that its operation, which is either to short the Rc and Rh nodes together or not to short the Rc and Rh nodes together. Whether the block 718 will short, or not short, the Rc and Rh nodes together is dictated solely by virtue of the particular combination of Rc and Rh connectors into which wires have been mechanically inserted. Block 718 will keep the Rc and Rh nodes shorted together, unless wires have been inserted into both the Rc and Rh connectors, in which case the block 718 will not short the Rc and Rh nodes together because a two-HVAC-transformer system is present. The insertion sensing circuitry 712 is also configured to provide at least two signals to the secondary processor 708, the first being a simple "open" or "short" signal that corresponds to the mechanical insertion of a wire, and the second being a voltage or other level signal that represents a sensed electrical signal at that terminal. The first and second electrical signals for each of the respective wiring terminals can advantageously be used as a basis for basic "sanity checking" to help detect and avoid erroneous wiring conditions.

Basic operation of each of the FET switches 706 is achieved by virtue of a respective control signal (e.g., W-CTL, Y-CTL) provided by the secondary processor 708 that causes the corresponding FET switch 706 to "connect" or "short" its respective HVAC lead inputs for an ON control signal, and that causes the corresponding FET switch 706 to "disconnect" or "leave open" or "open up" its respective HVAC lead inputs for an "OFF" control signal. By virtue of the above-described operation of block 718, it is automatically the case that for single-transformer systems having only an "R" wire (rather than separate Rc and Rh wires as would be present for two-transformer systems), that "R" wire can be inserted into either of the Rc or Rh terminals, and the Rh-Rc nodes will be automatically shorted to form a single "R" node, as needed for proper operation. In contrast, for dual-transformer systems, the insertion of two separate wires into the respective Rc and Rh terminals will cause the Rh-Rc nodes to remain disconnected to maintain two separate Rc and Rh nodes, as needed for proper operation.

Referring now to the powering circuitry 710 in FIG. 7, provided is a configuration that automatically adapts to the powering situation presented to the thermostat 102 at the time of installation and thereafter. The powering circuitry 710 comprises a full-wave bridge rectifier 720, a storage and waveform-smoothing bridge output capacitor 722 (which can be, for example, on the order of 30 microfarads), a buck regulator circuit system 724, a power-and-battery (PAB) regulation circuit 728, and a rechargeable lithium-ion battery 730. In conjunction with other control circuitry including backplate power management circuitry 727, head unit power management circuitry 729, and the secondary processor 708, the powering circuitry 710 is configured and adapted to have the characteristics and functionality described hereinbelow.

By virtue of the configuration illustrated in FIG. 7, when there is a "C" wire presented upon installation, the powering circuitry 710 operates as a relatively high-powered, rechargeable-battery-assisted AC-to-DC converting power supply. When there is not a "C" wire presented, the powering circuitry 710 operates as a power-stealing, rechargeable-battery-assisted AC-to-DC converting power supply. As illustrated in FIG. 7, the powering circuitry 710 generally serves to provide the voltage Vcc MAIN that is used by the various electrical components of the thermostat 102, and that in one embodiment will usually be about 3.7V~3.95V. The general purpose of powering circuitry 710 is to convert the 24 VAC presented between the input leads 719 and 717 to a steady DC voltage output at the Vcc MAIN node to supply the thermostat electrical power load.

Operation of the powering circuitry 710 for the case in which the "C" wire is present is now described. When the 24 VAC input voltage between nodes 719 and 717 is rectified by the full-wave bridge rectifier 720, a DC voltage at node 723 is present across the bridge output capacitor 722, and this DC voltage is converted by the buck regulator system 724 to a relatively steady voltage, such as 4.4 volts, at node 725, which provides an input current $I_{BP}$ to the power-and-battery (PAB) regulation circuit 728.

The secondary processor 708 controls the operation of the powering circuitry 710 at least by virtue of control leads leading between the secondary processor 708 and the PAB regulation circuit 728, which for one embodiment can include an LTC4085-4 chip available from Linear Technologies Corporation. The LTC4085-4 is a USB power manager and Li-Ion/Polymer battery charger originally designed for portable battery-powered applications. The PAB regulation circuit 728 provides the ability for the secondary processor 708 to specify a maximum value $I_{BP}(max)$ for the input current $I_{BP}$. The PAB regulation circuit 728 is configured to keep the input current at or below $I_{BP}(max)$, while also providing a steady output voltage Vcc, such as 4.0 volts, while also providing an output current Icc that is sufficient to satisfy the thermostat electrical power load, while also tending to the charging of the rechargeable battery 730 as needed when excess power is available, and while also tending to the proper discharging of the rechargeable battery 730 as needed when additional power (beyond what can be provided at the maximum input current $I_{BP}$(max)) is needed to satisfy the thermostat electrical power load.

Operation of the powering circuitry 710 for the case in which the "C" wire is not present is now described. As used herein, "inactive power stealing" refers to the power stealing that is performed during periods in which there is no active call in place based on the lead from which power is being stolen. As used herein, "active power stealing" refers to the power stealing that is performed during periods in which there is an active call in place based on the lead from which power is being stolen.

During inactive power stealing, power is stolen from between, for example, the "Y" wire that appears at node 719 and the Rc lead that appears at node 717. There will be a 24 VAC HVAC transformer voltage present across nodes 719/717 when no cooling call is in place (i.e., when the Y-Rc FET switch is open). For one embodiment, the maximum current $I_{BP}$(max) is set to a relatively modest value, such as 20 mA, for the case of inactive power stealing. Assuming a voltage of about 4.4 volts at node 725, this corresponds to a maximum output power from the buck regulator system 724 of about 88 mW. This power level of 88 mW has been found to not accidentally trip the HVAC system into an "on" state due to the current following through the call relay coil. During this time period, the PAB regulator 728 operates to discharge the battery 730 during any periods of operation in which the instantaneous thermostat electrical power load rises above 88 mW, and to recharge the battery (if needed) when the instantaneous thermostat electrical power load drops below 88 mW. The thermostat 700 is configured such that the average power consumption is well below 88 mW, and indeed for some embodiments is even below 10 mW on a long-term time average.

Operation of the powering circuitry 710 for "active power stealing" is now described. During an active heating/cooling call, it is necessary for current to be flowing through the HVAC call relay coil sufficient to maintain the HVAC call relay in a "tripped" or ON state at all times during the active heating/cooling call. The secondary processor 708 is configured by virtue of circuitry denoted "PS MOD" to turn, for example, the Y-Rc FET switch OFF for small periods of time during the active cooling call, wherein the periods of time are small enough such that the cooling call relay does not "un-trip" into an OFF state, but wherein the periods of time are long enough to allow inrush of current into the bridge rectifier 720 to keep the bridge output capacitor 722 to a reasonably acceptable operating level. For one embodiment, this is achieved in a closed-loop fashion in which the secondary processor 708 monitors the voltage $V_{BR}$ at node 723 and actuates the signal Y-CTL as necessary to keep the bridge output capacitor 722 charged. According to one embodiment, it has been found advantageous to introduce a delay period, such as 60-90 seconds, following the instantiation of an active heating/cooling cycle before instantiating the active power stealing process. This delay period has been found useful in allowing many real-world HVAC systems to reach a kind of "quiescent" operating state in which they will be much less likely to accidentally un-trip away from the active cooling cycle due to active power stealing operation of the thermostat 102. According to another embodiment, it has been found further advantageous to introduce another delay period, such as 60-90 seconds, following the termination of an active cooling cycle before instantiating the inactive power stealing process. This delay period has likewise been found useful in allowing the various HVAC systems to reach a quiescent state in which accidental tripping back into an active cooling cycle is avoided.

Correcting for Internal Heat-Generating Components

In some embodiments, the room temperature a smart thermostat displays may be different from another thermostat or thermometer. This is usually due to differences between the thermostats, the location of the thermostat, or thermostat activity. Some embodiments use multiple temperature sensors to determine the temperature in a home with a high degree of accuracy. The smart thermostats described herein may have as few as 3 temperature sensors, while others may have as many as 10 temperature sensors. These sensors are precision tuned to keep a home consistently comfortable. Real-world data is continuously analyzed to update software algorithms that improve temperature accuracy. Prior to this disclosure, thermostat manufacturers used various sensors and methods to calculate the ambient temperature in a home, often arriving at different ambient room temperature measurements. If a user makes a lot of adjustments on their thermostat in a short time, if the display is on for a long time, if there's an active software download or other things happening, the internal circuits in the thermostat can get warmer. This can cause the thermostat to think the room temperature is higher than it actually is and possibly delay heating or start cooling when it isn't needed. The temperature sensors of the embodiments described herein work together to monitor changes in the room temperature, as well as any temperature changes inside of the thermostat caused by the circuitry and display. Sensor data is used to compensate in real-time changes in the internal temperature to provide an accurate room temperature reading, and cool or heat when it is actually necessary. Based on collected data, the smart thermostats described herein are able to accurately determine temperature within 1° F. approximately 99% of the time.

Figure 8:
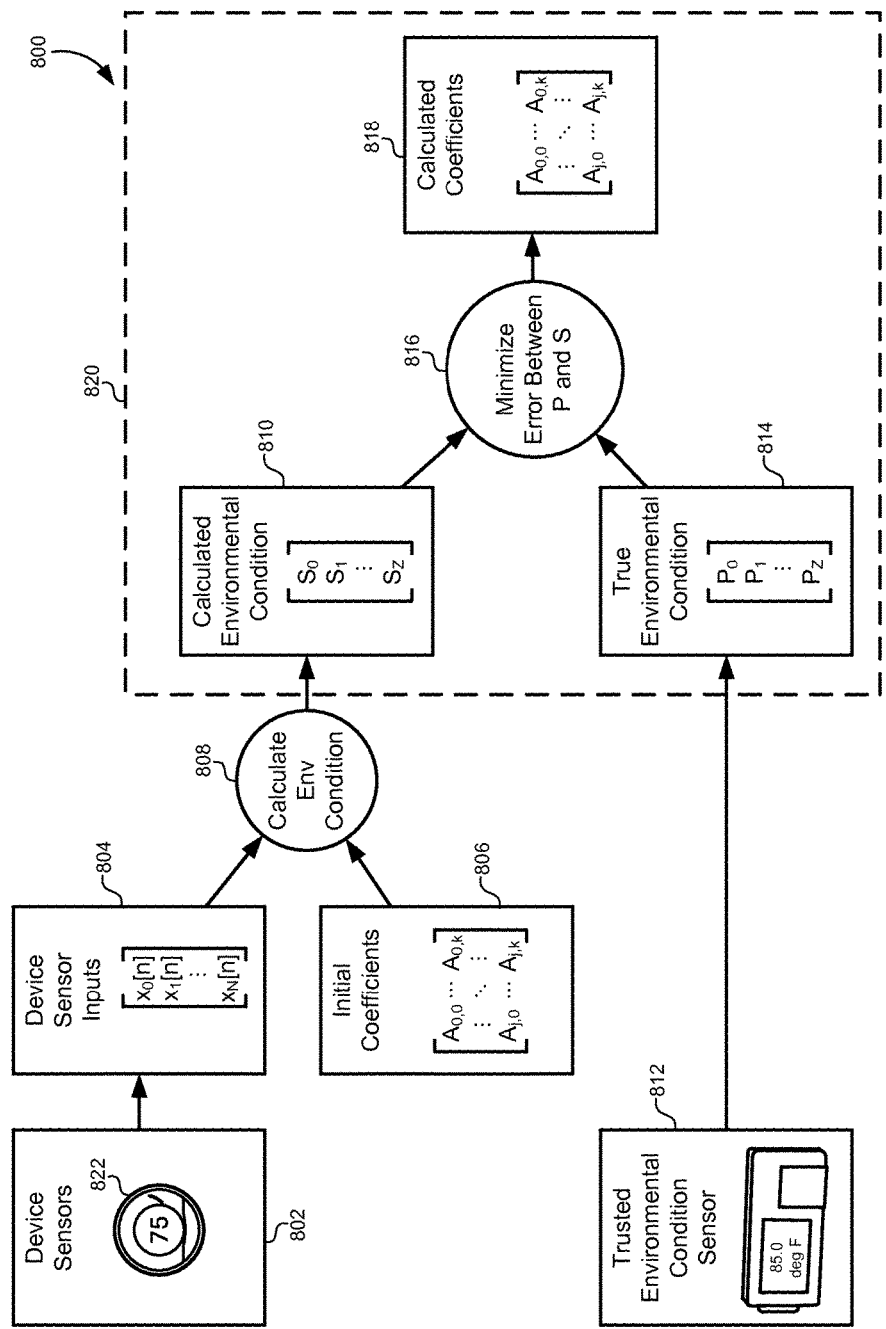
FIG. 8 illustrates a simplified block diagram of a system for compensating for internally generated environmental effects in a thermostat, according to some embodiments.

FIG. 8 illustrates a simplified block diagram 800 of a system for compensating for internally generated environmental effects in a thermostat, according to some embodiments. A measurement device 822 can be installed in an enclosure, such as a home, an office building, a warehouse, and so forth. The measurement device 822 can serve many different functions, one of which may be monitoring and recording an environmental condition of the enclosure, such as temperature, humidity, smoke content, noise levels, and so forth. The measurement device 822 may include numerous device sensors 802 that are configured to measure the particular environmental condition. For example, temperature sensors may measure temperature, smoke detectors may measure smoke presence, humidity sensors may measure humidity, microphones may measure noise levels, and so forth.

Some measurement devices 822 may include components or functions that affect a change on the environmental condition in the enclosure. By way of example, a thermostat may include heat-generating components that can affect the internal temperature of the measuring device 822. An intercom may include electronic components that generate noise that would affect a sound signature be recorded in the room. The embodiments described herein are designed to overcome the effects of the measurement device 822 on the environmental condition itself. In some embodiments, a plurality of device sensors 802 can be distributed throughout the internal components of the measuring device 822 to measure the environmental condition in different locations. For example, temperature sensors can be distributed throughout a thermostat and measure the temperature at various locations inside the thermostat. By distributing environmental condition sensors throughout the measurement device 822, an environmental condition signature can be generated for the device. Because components within the measurement device 822 may affect the environmental condition to different degrees, the distributed device sensors 802 can gather readings from various locations within the measurement device 822 relative to the active components.

In some embodiments, environmental condition sensors may be located within close proximity to components that affect the environmental condition. For example, a thermistor may be placed within 1 mm, 5 mm, 10 mm, 15 mm, etc. of a heat generating component in a thermostat. In one embodiment, the thermistor is placed within 1 mm of the respective heat-generating component. A one-to-one relationship between environmental condition sensors and components that affect the environmental condition may be established, such that each environmental condition sensor will primarily measure the effect that the particular components has on the environmental condition. In some embodiments, it has been found that good results can be achieved where the temperature sensor associated with each heat-generating component is placed closer to the associated heat-generating component than to any other heat-generating component or to any other temperature sensor. Additionally, for residential thermostats, good results can be achieved where the distance between the temperature sensor and its associated heat-generating component is less than ten percent of the average cross-sectional linear dimension of the thermostat.

In some embodiments, one or more environmental condition sensors may be located away from components that affect the environmental condition. For example, a temperature sensor may be placed away from heat generating components in a thermostat such that its reading will generally track the ambient temperature in the enclosure. Although the readings from these temperature sensors will also be affected by internal heating, the effect of the internal heating will be less than that seen by the temperature sensors in close proximity to heat-generating components.

In order to calculate the true environmental condition in the enclosure, also referred to herein as the "compensated environmental condition," the measurement device 820 can provide a vector of device sensor inputs 804 recorded at regular intervals. For example, the measurement device 822 can record readings from a plurality of different humidity sensors every 30 seconds, providing a vector of humidity readings every 30 seconds. These periodic readings can be stored as data vectors in a memory of the measurement device 822. In some embodiments, $x_i[n]$ is the reading of a particular sensor i at time n. In some embodiments, $x_i[n]$ may involve other calculations, such as the log of 1 plus the reading of a particular sensor i at time n. In some embodiments, $x_i[n]$ may be derived from multiple individual sensor values. For example, $x_i[n]$ could be the maximum of the reading from sensor i and sensor j.

At this point, it should be emphasized that the linear combination of sensor inputs and coefficients illustrated by FIG. 8 is merely exemplary and not meant to be limiting. This is simply one embodiment of the general inventive concept of calculating a compensated temperature that mitigates the self-heating effects of a device through the use of a plurality of temperature sensors and/or state information that provides information about self-heating effects. In light of this disclosure, one having skill in the art could use other nonlinear combinations or mathematical techniques to combine state information and/or sensor readings surrounding heat-generating components in order to calculate a compensated temperature.

The device sensor inputs 804 can be combined with a coefficient vector. The coefficient vector can include a weight for each of the device sensor inputs 804. The weights can be multiplied with the environmental condition readings from the device sensors 802, and the sun can be used to calculate the environmental condition 808. In effect, the coefficient vector represents how much each environmental condition sensor contributes to the true environmental condition value. For example, the calculated environmental condition 810 "S" can be determined using the following equation.

$$S_{comp}[n] = c + \sum_{j=0}^{M} A_j x_j[n] \tag{1}$$

In equation (1), M+1 represents the number of device sensors 802 and/or state inputs that can affect internal temperature, and n represents the moment in time when the environmental condition will be calculated from the device sensor inputs 804 $x[n]$, with c as an offset.

In some embodiments, the calculated environmental condition can be calculated using the instantaneous inputs from the device sensors 802, along with historical inputs from the device sensors 802. For example, the coefficient vector can instead comprise a coefficient matrix that provides weights for a current-time vector of device sensor inputs 804, $(x_N[n])$, along with weights for previous-time vectors of device sensor inputs 804, $(x_{N-1}[n], x_{N-2}[n])$, etc. By using historical device sensor inputs 804, a smooth compensated environmental condition calculation can be achieved. For example, if a particular component in the measurement device 822 rapidly effects the surrounding environmental condition (e.g., a Wi-Fi chip becomes very hot, very fast), the use of historical device sensor inputs 804 will act as a low-pass filter to mute the immediate effect of the particular device component. The calculated environmental condition 810 "S" can be determined using historical measurements and a coefficient matrix with the following equation.

$$S_{comp}[n] = c + \sum_{k=0}^{D} \sum_{j=0}^{M} A_{k,j} x_j[n-k] \tag{2}$$

In equation (2), D represents the number of stored device sensor inputs 804 used to calculate a current compensated environmental condition 808. In other words, D represents how far back in time the measurement device 822 will go in determining a current environment condition. In some embodiments, the value of D=20 has demonstrated acceptable results.

In order to generate an accurate compensated environmental condition, the coefficient matrix needs to accurately characterize the weight to be applied to each sensor input at each point in time. Block diagram 800 uses an initial coefficient matrix 806 that can be initially populated with a best-guess for each weight. In some embodiments, an initial set of sensor readings can be used to generate the initial coefficient matrix 806. In other embodiments, a zero matrix can be used along with random values. Using an initial coefficient matrix 806 will generally not provide accurate results. However, it can be used to generate inputs for an optimization algorithm, such as a linear regression algorithm, to gradually adjust the initial coefficient matrix 806 to eventually form an accurate calculated coefficient matrix 818. This optimization algorithm can be computed in real time at the smart-home device or at a remote management server. Alternatively, this optimization algorithm can be computed off-line, and the results can be transmitted to one or more smart-home devices.

The values of the calculated coefficient matrix 818 will generally depend on the architecture, arrangement, spacing, and layout of device components in the measurement device 822. Therefore, for a particular model of the measurement device 822 a calculated coefficient matrix 818 may be determined and applied to each of the measurement devices 822 that are manufactured. While the tolerances of individual components for each serial number of the measurement device 822 may cause slight variations, the overall operation of the devices will be similar enough that the calculated coefficient matrix 818 can be applied to each with very good results. In some embodiments, small adjustments may be made to the calculated coefficient matrix 818 during the lifetime of each device to personalize each calculated coefficient matrix 818 for the particular device.

In order to generate the calculated coefficient matrix 818, a true indication of the environmental condition is needed. Training data may be provided from a trusted environmental condition sensor 812 that is assumed to accurately measure the environmental condition in the enclosure. The trusted environmental condition sensor 812 can be placed in close proximity to the measurement device 822 within the enclosure, such that the trusted environmental condition sensor 812 accurately measures the environment condition that the measurement device 822 should measure in the absence of internal of the effects of the components that affect the measurement. In order to obtain this trading data, measurement devices 822 may be installed in user homes along with a trusted environmental condition sensors 812 during a training interval (e.g. two weeks, one month, six months, etc.). Both the measurement device 822 and the trusted environmental condition sensor 812 can log data readings and transmit the data readings to a central data management server. The trusted environmental condition sensor 812 will be assumed to provide a time vector of true environmental condition measurements 814. The measurement device 822 will provide essential data management server with calculated environmental condition values 810 that can be compared to the true environmental condition measurements 814. A linear regression algorithm can then be used by the central data management server to minimize the error 816 between the calculated environmental condition values 810 and the true environmental condition measurements 800. In some embodiments, the mean-squared error between the true environmental condition measurements 814 and the calculated environmental condition values 810 can be minimized, resulting in a standard problem in linear algebra. The result of the linear regression algorithm will be a set of calculated coefficients 818 that accurately characterizes the contribution of each device sensor 802 over a time interval preceding the time of the compensated environmental condition calculation. Particular equations for minimizing the error between the calculated environmental condition values 810 and the true environmental condition measurements 813 may depend on the particular type of environmental condition being measured, and example equations will be described in greater detail below. In addition to minimizing the error, the optimization can also create a "smoothness" to time-series of temperature calculations. This can eliminate "spiky" measurements that not only contribute error but can interfere with the normal control of, for example, an HVAC system.

Figure 9:
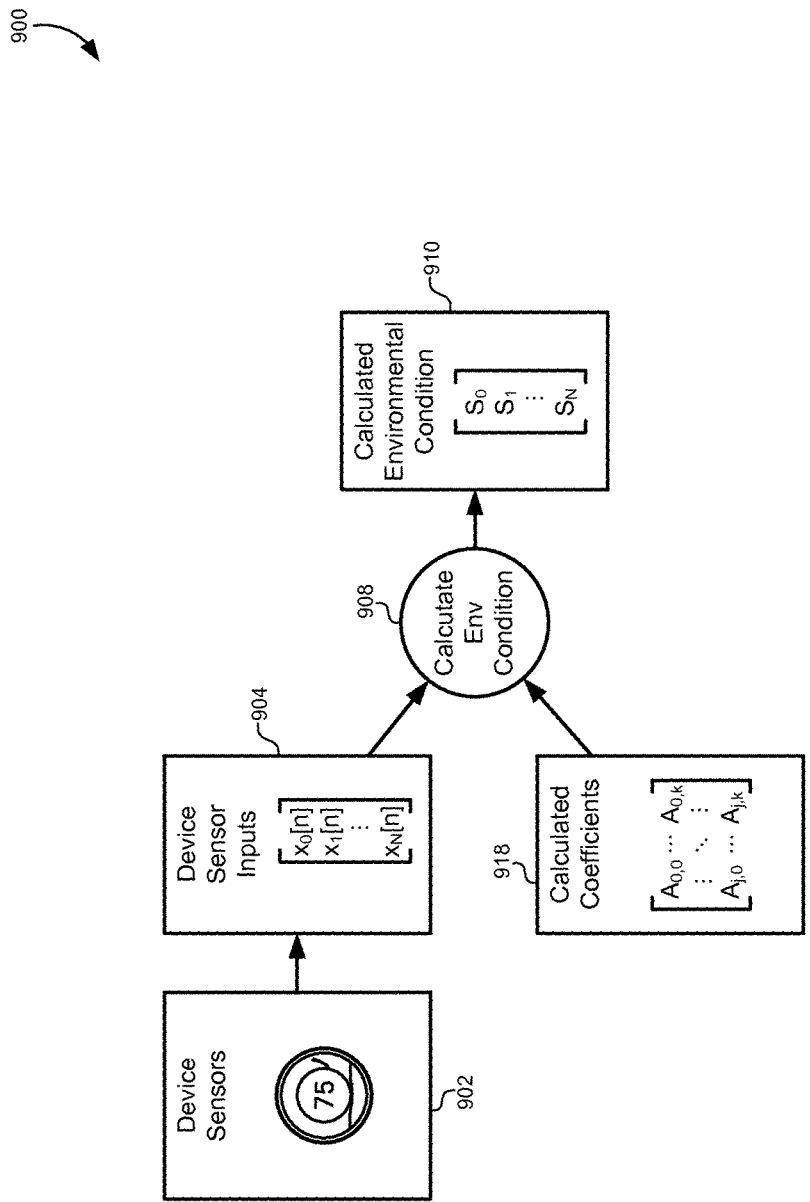
FIG. 9 illustrates a method of using calculated coefficients to calculate an environmental condition, according to some embodiments.

FIG. 9 illustrates a diagram 900 of method of using calculated coefficients 918 to calculate an environmental condition value, according to some embodiments. After generating the calculated coefficients 818 from FIG. 8, they can be downloaded or installed as a coefficient matrix 918 in the measurement device. This coefficient matrix 918 can then be used in real time as the measurement device receives device sensor inputs 904 from the device sensors 902. Periodically, the measurement device can calculate 908 the environmental condition 910 to be used during normal operation of the measurement device.

The remainder of this disclosure will focus on one particular set of embodiments of the measurement device comprising a thermostat. However, it will be understood that the general algorithm and architecture described above can be used on any measurement device that measures an environmental condition. Therefore, the embodiments described below using a thermostat are merely exemplary and not meant to be limiting.

A smart thermostat will generally include one or more temperature sensors that are primarily used to measure the ambient temperature in the enclosure surrounding the thermostat. While these temperature sensors will generally measure the ambient temperature within a few tenths of a degree of the true value, they unfortunately are affected by heat-generating components inside the thermostat. For example, the thermostat embodiment described above will include power management integrated circuits, battery charging chips, Bluetooth chips, Wi-Fi chips, other wireless communication chips, chips that power advanced user interfaces, and various microcontrollers/microprocessors. When in an active state, each of these thermostat components may generate a substantial amount of heat. The heat generated by these components may affect the measurements recorded by the ambient temperature sensors and make a room appear hotter than it truly is. This can cause discomfort for occupants as the thermostat causes the HVAC system to excessively cool the enclosure, and will generally result in increased power consumption and air conditioning costs. In the winter, the thermostat may erroneously determine that the enclosure is warm enough and prevent the HVAC system from heating the enclosure according to the occupants' desires.

In some embodiments, the smart thermostat may compensate for internal heating by using a plurality of ambient temperature sensors and linearly extrapolate an ambient temperature from these measurements. For example, a thermostat may place a temperature sensor at the lower front portion of the thermostat away from heat generating components (e.g., a $T_g$ "grill" temperature sensor). The thermostat may also utilize a temperature sensor placed on the head unit circuit board that is somewhat more affected by the heat-generating components (e.g., the $T_{hu}$ "head unit" temperature sensor). Using only these two sensors, the difference $T_{hu}-T_g$ may be taken as an estimate of the heating caused by the device itself, and by subtracting this from $T_g$, the ambient temperature can be estimated by the following equation.

$$T_{comp}=2T_g-T_{hu} \qquad (3)$$

While equation (3) may provide satisfactory results for thermostats that generate a moderate amount of internal heat, more precise measurements are possible, particularly for thermostats with heat-generating components that generate heat quickly and excessively if left on for long periods of time. Therefore, following the methodology described in relation to FIG. 8, additional temperature sensors can be strategically placed throughout the thermostat in order to measure the heat generated by each heat-generating component. In some embodiments, a temperature sensor may be placed next to (e.g., within 3 mm, 5 mm, or 10 mm) each heat-generating component. These temperature sensor readings can be combined with the ambient temperature sensor readings and the calculated coefficient matrix 918 to generate a more accurate calculation of the compensated temperature.

While some embodiments may use temperature sensor ICs or SIOCs to provide multiple advanced functions and digital readouts, these may be problematic for smart thermostats with low power concerns. Some embodiments of the smart thermostat may use a power-stealing circuit to harvest power from the HVAC system. Energy harvested from the HVAC system can be supplemented by a rechargeable battery. During times when the heat-generating components are in a sleep mode, the power harvested from HVAC system can be used to charge the rechargeable battery. During times when the heat-generating components are in a wake mode, the power harvested from the HVAC system can be supplemented by energy stored in the rechargeable battery. Some embodiments may use a super capacitor or other energy storage device in the place of a rechargeable battery. In order to conserve steady-state power and provide an ample supply of power to charge the rechargeable battery, some embodiments may use low-power thermistors to monitor the temperature of the heat-generating components. A thermistor is a type of resistor wherein the resistance is more dependent on temperature than in standard resistors. Thermistors can be paired with voltage divider circuits to provide an accurate temperature reading while drawing very little power. For example, the NCP15WF104F03RC thermistor from Murata Power Solutions® may be used in some embodiments of the smart thermostat.

Some embodiments may use circuit board layouts that approximate an even distribution of heat-generating components over the surface area of the circuit board and throughout the interior of the smart thermostat. This can allow temperature sensors (e.g., thermistors) to be paired in a one-to-one relationship with each heat-generating component. For example, a Wi-Fi chip and a microprocessor may both be considered heat-generating components, and these components can be spaced on the thermostat circuit board such that temperature sensors can be placed next to each component and primarily measure the heating effect of their respective components. Therefore, one temperature sensor may be assigned to the microprocessor, one temperature sensor may be assigned to the Wi-Fi chip, and so forth. Although each temperature sensor will be affected by other heat generating components in the thermostat, the primary response of each temperature sensor will be attributable to its assigned heat generating component.

Figure 10:
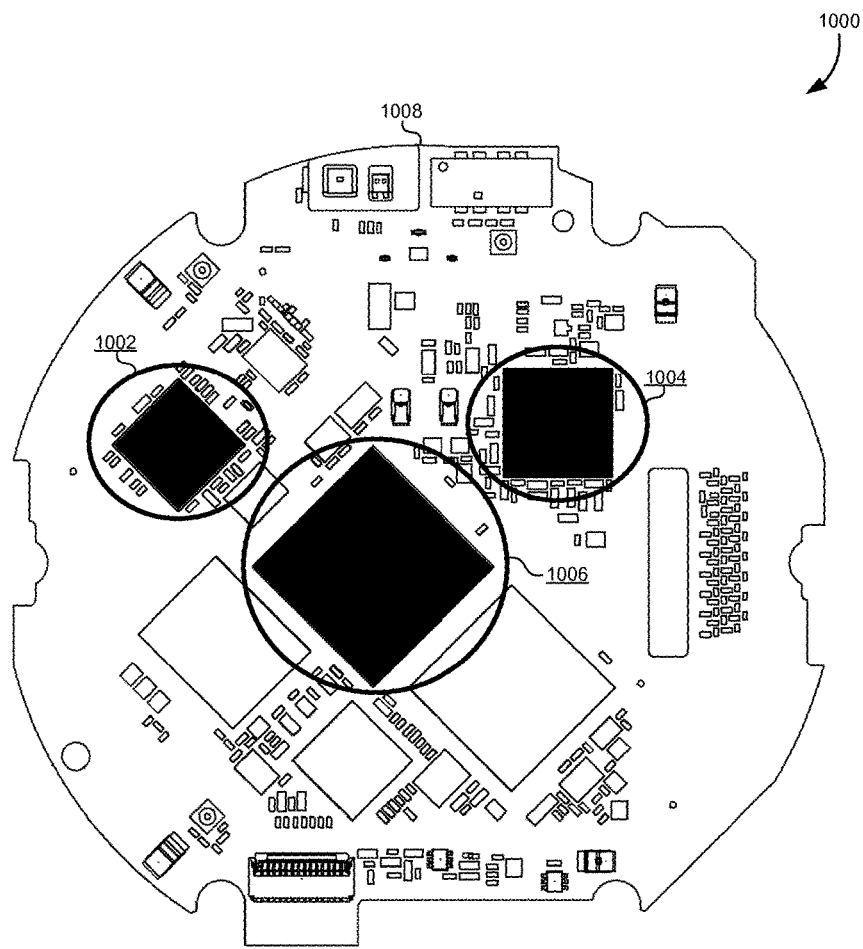
FIG. 10 illustrates a front view of a circuit board in a thermostat that includes heat-generating components, according to some embodiments.

FIG. 10 illustrates a front view 1000 of a circuit board in a thermostat that includes heat-generating components, according to some embodiments. Circuit board 1008 corresponds to the head unit circuit board of the smart thermostat described above. Three heat-generating components are highlighted on the circuit board 1008. Heat generating component 1002 represents a high-performance integrated ZigBee/802.15.4 system-on-a chip (part no. EM3581) used to establish a local smart home device network. Heat generating component 1006 represents a 32-bit ARM microcontroller (part no. STM32L151—sometimes referred to as the "head unit processor") that performs most of the temperature algorithms of the thermostat and generally controls most of the advanced thermostat functions. Heat generating component 1004 represents a power management integrated circuit (part no. SMPF0200SIAEP). Each of these heat generating components 1002, 1004, 1006 has a small thermistor (part no. NCP15WF104F03RC) located on the circuit board. Note that these thermistors are generally very small compared to the heat-generating components 1002, 1004, 1006, and are thus not shown on the circuit board 1008 for clarity. However, these thermistors are generally placed within a few millimeters of the heat-generating components 1002, 1004, 1006.

Figure 11:
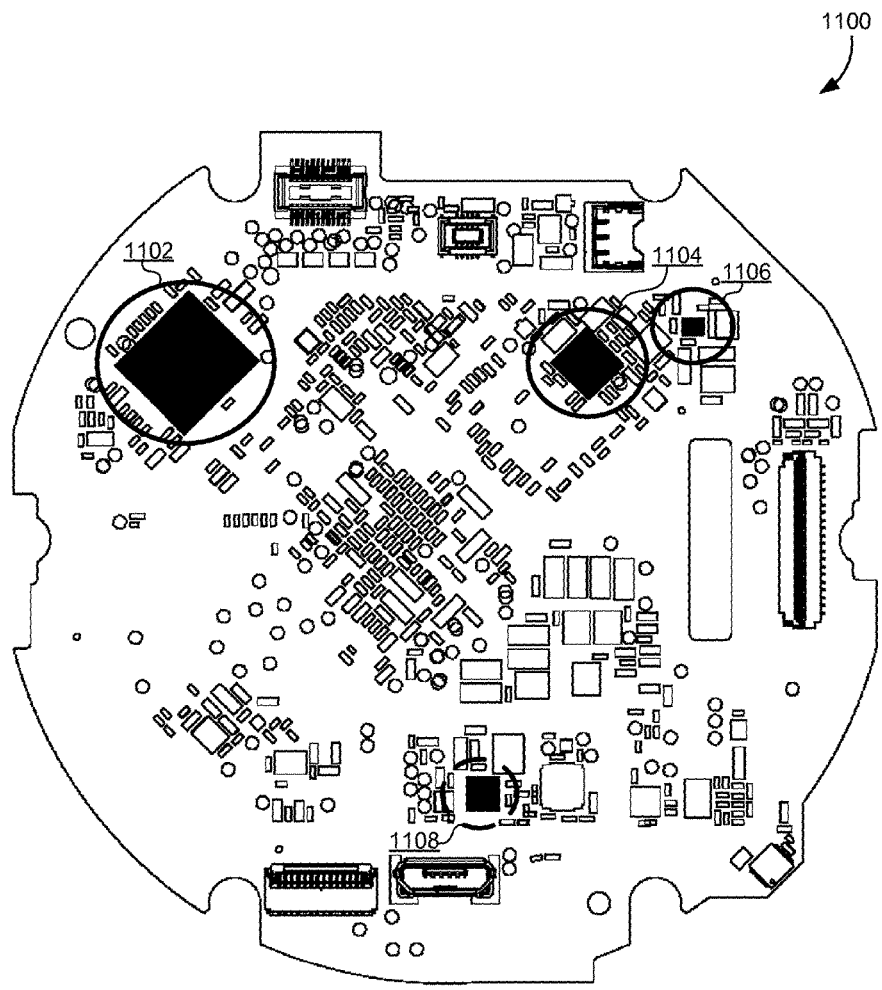
FIG. 11 illustrates a back view of a circuit board in a thermostat that includes heat-generating components, according to some embodiments.

FIG. 11 illustrates a back view 1100 of a circuit board in a thermostat that includes heat-generating components, according to some embodiments. The circuit board corresponds to the front view 1000 of circuit board 1008 in FIG. 10. On the reverse side, four additional heat-generating components are mounted. In some embodiments, heat generating components 1102, 1104, 1106, and 1108 are mounted in positions such that they did not share the same circuit board area as the heat generating components 1002, 1004, 1006 on the reverse side of the circuit board. Heat generating component 1102 represents a Wi-Fi 802.11 and Bluetooth 4.0 radio chip (part no. BCM43340). Heat generating component 1104 represents a USB power manager from Linear Technologies® (part no. LTC4085EDD-4) for charging a rechargeable battery. Heat generating component 1106 represents a backlight boost driver (part no. LM3695) for the user interface display. Heat generating component 1108 represents a low-power Bluetooth smart SoC from Dialog Semiconductor® (part no. DA14580). Like heat generating components 1002, 1004, 1006, heat generating components 1102, 1104, 1106, 1108 each have a dedicated thermistor mounted within a few centimeters on the circuit board. Therefore, the seven heat-generating components from FIG. 10 and FIG. 11 are each coupled with their own individual thermistors, which in turn provide temperature inputs to the algorithm described above for calculating a compensated temperature. In effect, these thermistors measure the instantaneous contribution from each of the heat generating components, and combined with the coefficient matrix, can be used to calculate the effect they have on the temperature measured by the main ("second") temperature sensors.

Figure 12:
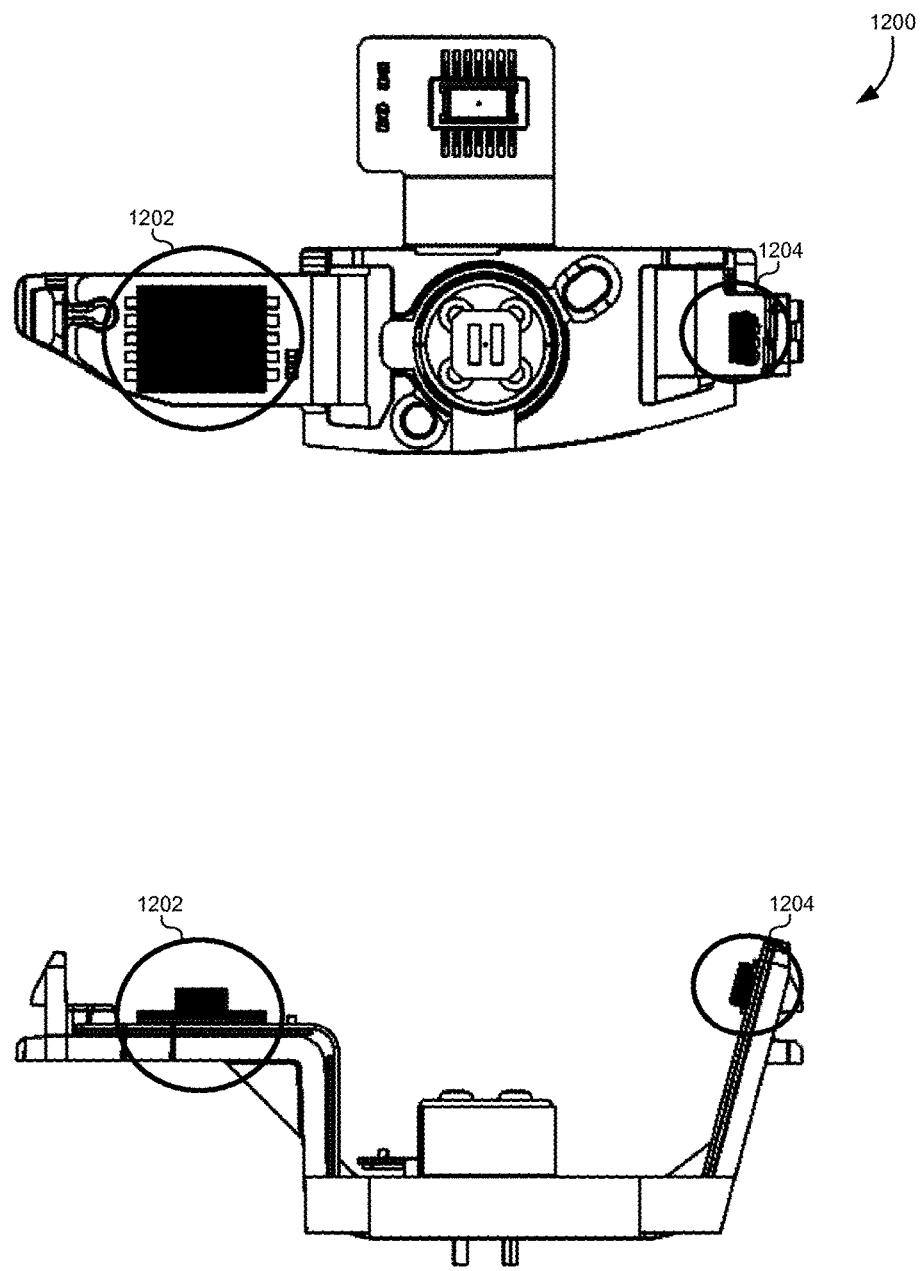
FIG. 12 illustrates a sensor board for a temperature sensor, according to some embodiments.

FIG. 12 illustrates various views 1200 of a sensor flex assembly for the main temperature sensors, according to some embodiments. Digital temperature sensor 1204 from Texas Instruments (part no. TMP112) is mounted on a sensor flex assembly and positioned near the lower front portion of the thermostat. Digital temperature sensor 1204 is thermally isolated from the rest of the internal thermostat components and coupled to the front of the thermostat using thermal grease. This arrangement isolates the digital temperature sensor 1204 as much as possible from the effect of internal heating caused by the heat-generating components described above. Digital temperature sensor 1204 may be referred to herein as a "second temperature sensor" and characterized in that it is positioned and configured to measure the ambient temperature of the environment outside of the thermostat, as opposed to measuring heat generated from a specific heat-generating component inside a thermostat. Digital temperature sensor 1204 may also be referred to as a "grill temperature sensor" ($T_g$).

In addition to the digital temperature sensor 1204, the sensor flex assembly includes a four-channel thermopile 1202 from AsahiKASEI® (part no. AK9750) that may also function as a "second temperature sensor." In some embodiments, the primary purpose of the four-channel thermopile 1202 is to act as a near-field proximity sensor to detect user movements towards the thermostat. User movements may be used to detect occupancy and/or predict when the user intends to interact with the thermostat such that the user interface can be preemptively activated and provide a pleasing user experience. The four-channel thermopile 1202 can also be used to detect temperature in the room. Generally, the DC component of a response received on any channel of the four-channel thermopile 1202 characterizes the ambient IR energy in the room. For detecting user movements, the DC channel is filtered out using a digital bandpass filter before being processed by the processing system. However, an unfiltered version of the signal can be used to isolate the DC component and measure an approximation of the temperature in the room.

Figure 13:
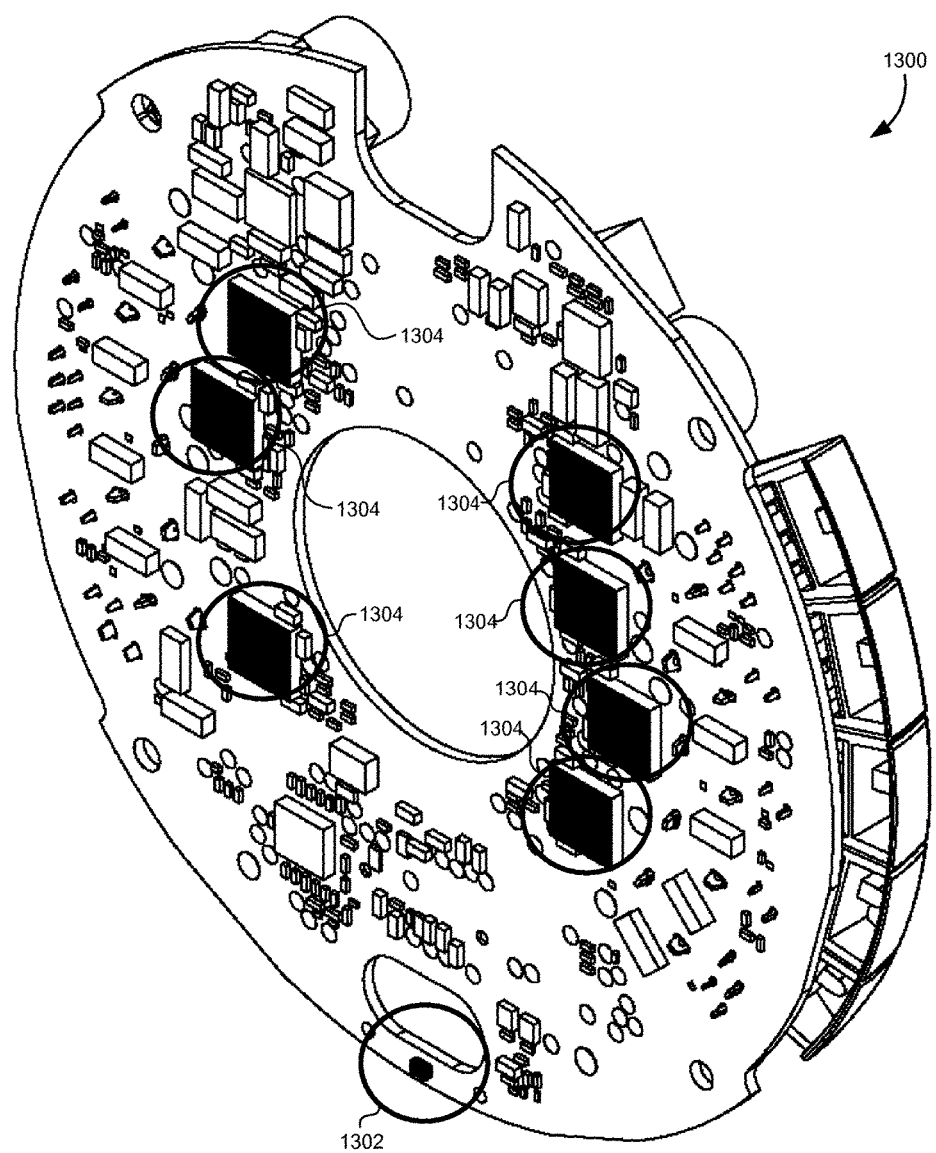
FIG. 13 illustrates a back plate circuit board with a backup temperature sensor, according to some embodiments.

FIG. 13 illustrates a view 1300 of a back plate circuit board with an auxiliary temperature sensor, according to some embodiments. The back plate circuit board includes a back plate temperature sensor 1302 with an integrated humidity sensor from Sensiron (part no. SHTW1). In some embodiments, the back plate temperature sensor 1302 may be considered to be more thermally isolated than the grill temperature sensor or a head unit temperature sensor mounted on the head unit circuit board. This is primarily due to its location at the rear lower portion of the thermostat adjacent to a wall on which the thermostat is mounted. Some embodiments may also use the back plate temperature sensor 1302 as one of the "second" temperature sensors used primarily to sense temperature outside of the thermostat rather than the temperature generated by a specific heat-generating component.

In some embodiments, the back plate circuit board includes seven HVAC control FETs 1304 that are used to provide electrical isolation between the thermostat and the HVAC system and to connect the 24 VAC signal from the HVAC signal wires to the return wires in order to activate one or more of the HVAC functions. During normal operation, the HVAC control FETs 1304 can also generate a noticeable amount of heat. Therefore, some embodiments may add between one and seven additional thermistors—each being placed next to a corresponding one of the HVAC control FETs 1304—in order to determine the contribution to internal heating effects made by the HVAC control FETs 1304.

Figure 14:
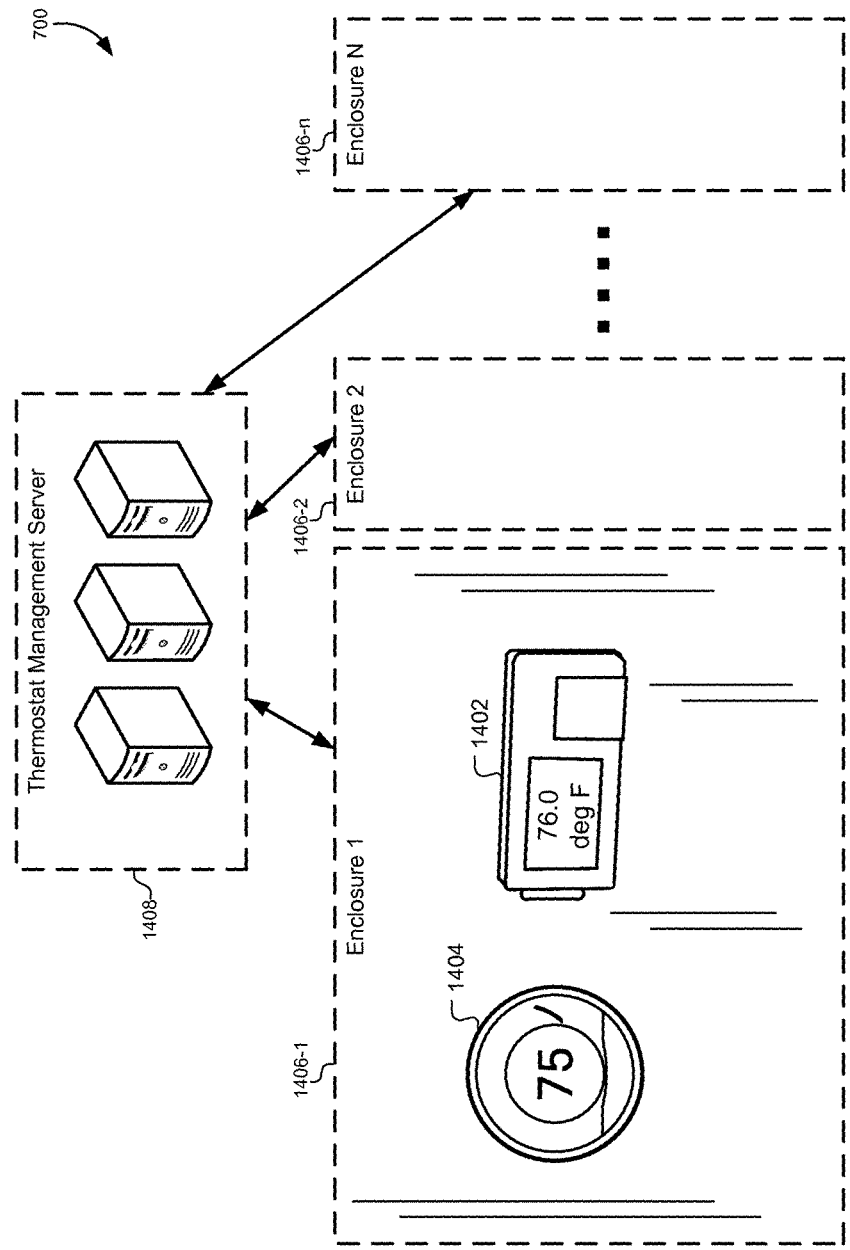
FIG. 14 illustrates a system for a thermostat management server to collect training data from a plurality of enclosures in order to calculate a coefficient matrix, according to some embodiments.

FIG. 14 illustrates a system 1400 for a thermostat management server to collect training data from a plurality of enclosures 1406 in order to calculate a coefficient matrix, according to some embodiments. As described above, the coefficient matrix represents a set of weights, or contributions, for each heat-generating component and temperature sensor in the thermostat for calculating a compensated temperature that accurately represents the ambient temperature in the enclosure. The weights in the coefficient matrix are generally determined by physical properties of the thermostat, such as placement of the heat-generating components on the circuit boards, distance between the heat-generating components and the thermistors/temperature sensors, thermal isolation of other materials in the thermostat, and so forth. Therefore, a calculated coefficient matrix should be applicable to all devices having the same design.

Although the physical characteristics of thermostats having the same design do not change significantly from one thermostat to another, some installation and usage characteristics of individual thermostats may affect the calculation of the coefficient matrix. For example, a thermostat mounted on a wall that is used very frequently might have a slightly different coefficient matrix than a thermostat mounted on a stand that is used relatively infrequently. Therefore, while the general values of the coefficient matrix will be similar for each thermostat having a common design, there may be small differences between thermostats that should be taken into account.

In order to generate a coefficient matrix that is generally applicable to all thermostats of a particular design, a thermostat management server 1408 can collect temperature data from a plurality of enclosures 1406. In some embodiments, the thermostat 1404 can be mounted in each enclosure 1406 in the training group of enclosures in close proximity to a calibrated and trusted temperature sensor 1402, such as the HOBO® digital temperature loggers available from Onset®. The trusted temperature sensor 1402 can be configured to take a temperature reading of the enclosure at the same time that the thermostat 1404 completes its temperature readings. The temperature readings from both the thermostat 1404 and the trusted temperature sensor 1402 can be transmitted to a thermostat management server 1408. At thermostat management server 1408, the readings from the thermostat 1404 and the readings from the trusted temperature sensor 1402 can be combined to calculate a coefficient matrix as described above in relation to FIG. 8.

A coefficient matrix can be calculated for each specific enclosure 1406 in a training group of enclosures. While the specific coefficient matrices could be used for each individual thermostat 1404, it is desirable to generate a coefficient matrix that is generally applicable to all thermostats, even outside of the training group. Therefore, the individual weights within the coefficient matrix can be averaged across the coefficient matrices of the training group to generate an overall average coefficient matrix for any thermostat sharing this particular design. This coefficient matrix can then be preloaded on thermostats as they are manufactured or later in a post-manufacturing process. The coefficient matrix can also be periodically tested, updated, and downloaded to existing thermostats in communication with the thermostat management server 1408.

Figure 15:
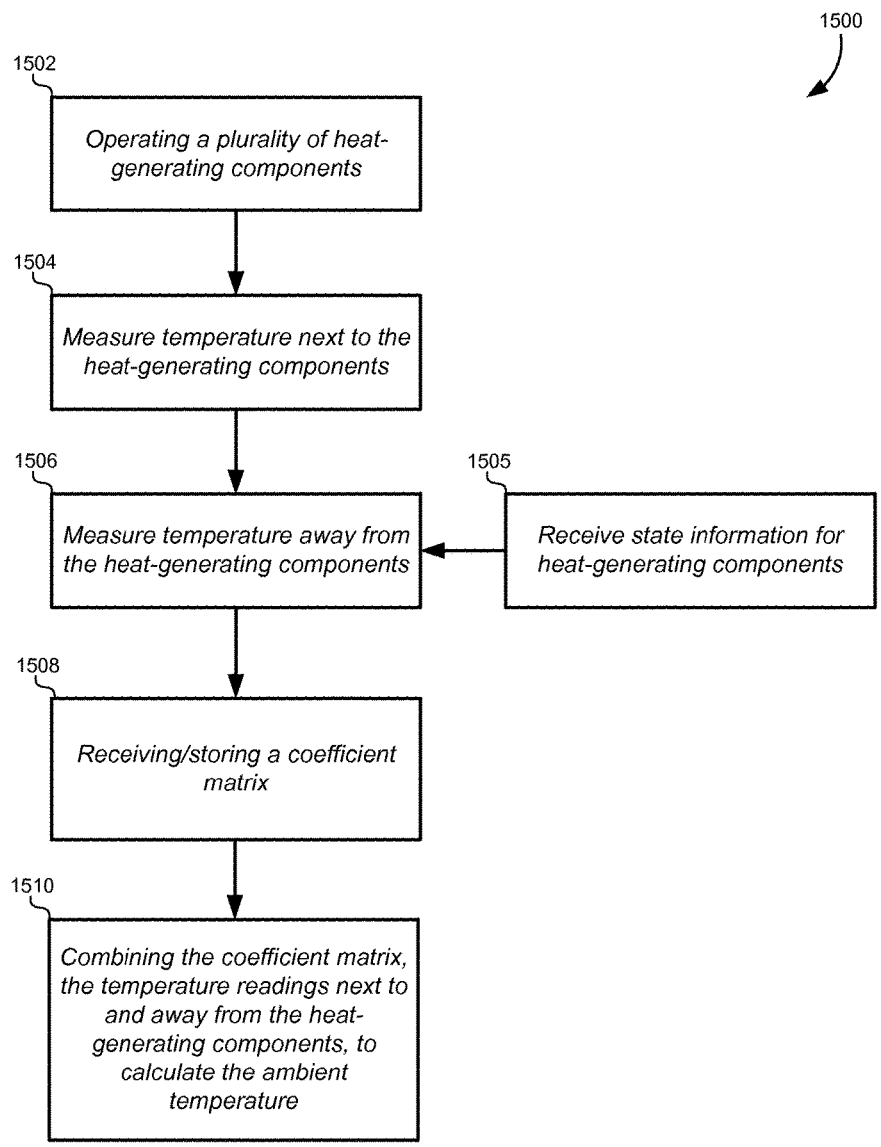
FIG. 15 illustrates a flowchart of a method for compensating for internal heat-generating components in a thermostat measuring ambient temperature, according to some embodiments.

FIG. 15 illustrates a flowchart 1500 of a method for compensating for internal heat-generating components in a thermostat measuring ambient temperature, according to some embodiments. The method may include operating a plurality of heat-generating components (1502). Designating one of the many components within a digital thermostat as "heat-generating" may depend on absolute and/or relative factors. In some embodiments, a predefined number of components producing the highest amount of heat may be selected as heat-generating components. For example, the seven ICs that generate the most heat could be designated as heat-generating components. In some embodiments, components that generate more than a threshold amount of heat may be designated as heat-generating components. For example, ICs that reach a temperature above 100° F. during normal operation cycles may be designated as heat-generating components. Alternatively, heat-generating components can be designated as components that generate a predetermined threshold level of heat energy or wattage.

The method may also include measuring a temperature next to each of the heat-generating components (1504). These temperature readings may be received from temperature sensors that are within a specified minimum distance of their respective heat-generating components, while being at least a specified maximum distance away from other heat generating components. For example, a temperature sensor may be placed within 2 to 5 mm of its respective heat-generating component, while being a minimum of 5 mm away from other heat-generating components. In low-power smart thermostats, these temperature sensors may be implemented using low-power thermistors and voltage dividers. As described above, this step may also involve using duty cycles or operational states of heat-generating components (1505). In theory, having perfect state information could eliminate the need for additional temperature sensors near the heat-generating components altogether. In some embodiments, temperature measurements from temperature sensors can be replaced and/or supplemented by state information of the sheet-generating components.

The method may additionally include measuring a temperature away from the heat-generating components (1506). These temperature readings may be received from temperature sensors positioned and configured to measure the ambient temperature in an enclosure rather than specifically measuring heat generated by heat-generating components. Although these temperature sensors will still be affected by heat from the heat-generating components, that effect will be much less than that experienced by the temperature sensors from step 1504. These temperature sensors may be thermally isolated from the rest of the thermostat by placing them at least 5 mm to 20 mm away from heat-generating components. These sensors may also be placed near the housing of the thermostat and coupled to the housing of the thermostat using thermal grease or other heat-conductive materials. Some embodiments may use more than one temperature sensor to measure the ambient temperature away from the heat-generating components. For example, some embodiments may use a temperature sensor that is placed near a lower front portion of the housing (a grill sensor), a temperature sensor that is mounted on the head unit circuit board (a head unit sensor), and/or a temperature sensor that is mounted to a lower rear portion of the thermostat (a backplate sensor).

The method may further include receiving/storing a coefficient matrix (1508). As discussed extensively above, a coefficient matrix may include weights for each of the inputs for calculating a compensated temperature value. The coefficient matrix may include a column for each input used in the calculation, and a row for each historical input vector used in the calculation. For example, an embodiment with 11 inputs that used the 20 previous input vectors to calculate a current compensated temperature would yield a 20×11 coefficient matrix. The matrix may be calculated locally or may be downloaded from a central management server.

The method may also include combining the coefficient matrix, the temperature readings next to the heat-generating components, and the temperature readings away from the heat-generating components to calculate a compensated temperature, which represents an accurate estimate of the ambient temperature in the enclosure (1510). The general process described in relation to FIGS. 1-2 can be modified and narrowed to specifically calculate temperature. The sensor inputs from the device may correspond to temperature readings from the different temperature sensors distributed throughout the thermostat. In some embodiments, inputs besides temperature readings may be used in the input set. For example, some embodiments may use duty cycles of particular heat-generating components, such as a main processor or user interface display.

Figure 16:
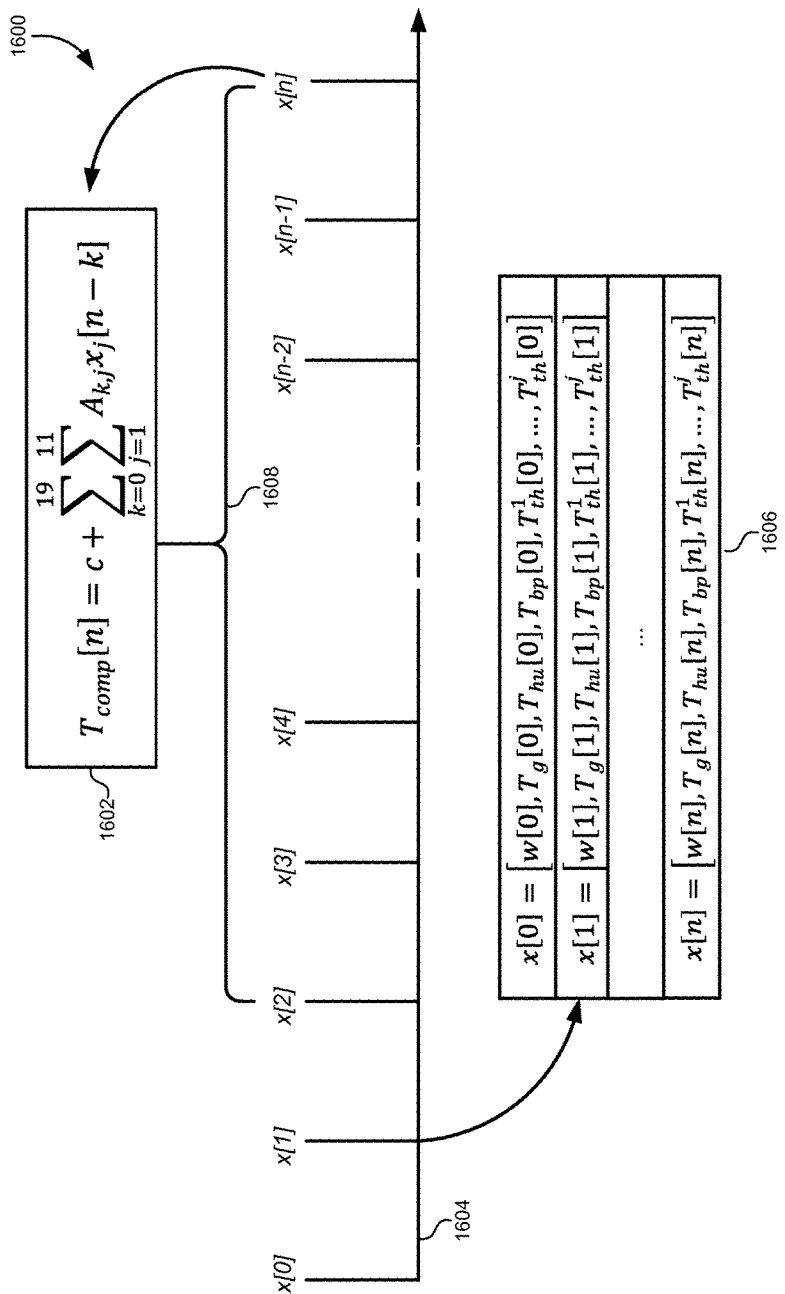
FIG. 16 illustrates a timing diagram for calculating ambient temperature using historical measurements and calculations, according to some embodiments.

FIG. 16 illustrates a timing diagram 1600 for calculating a compensated temperature using historical measurements and calculations, according to some embodiments. Timeline 1604 illustrates a continuous sampling of sensor readings at regular time intervals, such as every 1 second, every 5 seconds, every 10 seconds, every 30 seconds, every 60 seconds, and/or the like. The index n refers to the current time index of each particular sample. Temperature may be measured in degrees Celsius. For notational convenience, each vector of sensor readings at each time n can be expressed as an 11-tuple row vector as follows.

$$x[n]=[w[n],T_g[n],T_{hu}[n],T_{bp}[n],T_{th}^1[n],\ldots,T_{th}^j[n]] \quad (4)$$

The values for each of the variables in the vector expressed by equation (4) can be given as follows in Table 1.

TABLE 1

| Symbol | Variable descriptions |
|---|---|
| | Description |
| w [n] | Fraction of 30-second period ending at time n that the head unit microprocessor is awake |
| $T_g$ [n] | Grille temperature sensor measurement at time n |
| $T_{hu}$ [n] | Head unit temperature sensor measurement at time n |
| $T_{bp}$ [n] | Base plate temperature sensor measurement at time n |
| $T_{th}^j$ [n] | Thermistor j measurement at time n (for 7 thermistors next to heat-generating components). |

In one particular embodiment, the algorithm may use a 20×11 coefficient matrix A with an offset c. (In some cases, the offset c may be removed by fixing it to zero.) A matrix of this size will use 11 total sensor inputs at each time n, corresponding to w[n], $T_g$[n], $T_{hu}$[n], $T_{bp}$[n], and seven thermistors, $T_{th}^1$[n]–$T_{th}^7$[n], next to heat-generating components. This matrix also uses historical readings 1608, which correspond to using the current vector of sensor measurements as well as the 19 previous sensor measurements (for a total of 20). Each column in the coefficient matrix A will correspond to the weights given to a particular sensor reading, and each row in the coefficient matrix A will correspond to the weights given to each time n, n–1, n–2, and so forth, previous to the current time. Each of the historical vectors of sensor measurements may be stored in a memory 1606. The stored vectors may be used for calculating future compensated temperatures and may be transmitted to a central monitoring server for data logging and analysis purposes.

For initialization purposes, for each time n where n is less than 19, any values for which n<0 can be initialized to x[n=–19 . . . –1]=x[n=0]. The current compensated temperature can then be calculated using the following equation 1602.

$$T_{comp}[n] = c + \sum_{k=0}^{19}\sum_{j=1}^{11} A_{k,j} x_j[n-k] \quad (5)$$

For descriptive purposes, the design process for calculating a compensated temperature and generating a coefficient matrix may become clearer if the matrix A and blocks of the 20×11 vectors are "reshaped" into 1-dimensional vectors, with c included with A and a constant 1 included with the vectors. The problem can then be reformed as:

$$\beta = \begin{bmatrix} c \\ A_{0,1} \\ A_{0,2} \\ \vdots \\ A_{0,11} \\ \vdots \\ A_{19,1} \\ A_{19,2} \\ \vdots \\ A_{19,11} \end{bmatrix} \text{ and } X[n] = \begin{bmatrix} 1 \\ x_1[n] \\ x_2[n] \\ \vdots \\ x_{11}[n] \\ \vdots \\ x_1[n-19] \\ x_2[n-19] \\ \vdots \\ x_{11}[n-19] \end{bmatrix}. \quad (6)$$

Equation (5) then becomes $$T_{comp}[n] = (X[n])^T \beta. \quad (7)$$

After receiving training data from one or more thermostats distributed in homes and in communication with the central management server, a matrix of training data can be formed as:

$$X = \begin{bmatrix} (X[0])^T \\ (X[1])^T \\ \vdots \\ (X[N-1])^T \end{bmatrix}. \quad (8)$$

In order to generate a coefficient matrix, the training data may be compared to a target vector of accurate temperature readings, such as temperature readings from a co-located temperature logging device (e.g., a "Hobo"). The matrix of accurate temperature readings can be formed as:

$$y = \begin{bmatrix} T_{amb}[0] \\ T_{amb}[1] \\ \vdots \\ T_{amb}[N-1] \end{bmatrix}. \quad (9)$$

To generate the coefficient matrix A, the goal is for $X\beta$ to be a good approximation of y. To minimize only the mean-squared error over the training data, $\beta$ can be chosen as:

$$\beta = (X^T X)^{-1} X^T y. \quad (10)$$

However, because the objective is to minimize a weighted combination of the mean-squared error and the quadratic total variation as described above, a matrix of row differences of X can be defined as:

$$\Gamma = \begin{bmatrix} (X[1] - X[0])^T \\ (X[2] - X[1])^T \\ \vdots \\ (X[N-1] - X[N-2])^T \end{bmatrix}. \quad (11)$$

If $\gamma$ is defined as a scalar regularization parameter, then $\beta$ can be chosen as:

$$\beta = (X^T X + \gamma \Gamma^T \Gamma)^{-1} X^T y. \quad (12)$$

Equation (12) represents a form that can be solved using a Tikhonov-regularized linear least-squares regression. Using this method, the value for the coefficient matrix A can be determined and used to calculate the compensated temperature.

Various modifications may be made without departing from the spirit and scope of the invention. It is to be further appreciated that the term thermostat, as used hereinabove and hereinbelow, can include thermostats having direct control wires to an HVAC system, and can further include thermostats that do not connect directly with the HVAC system, but that sense an ambient temperature at one location in an enclosure and cooperatively communicate by wired or wireless data connections with a separate thermostat unit located elsewhere in the enclosure, wherein the separate thermostat unit does have direct control wires to the HVAC system. Accordingly, the invention is not limited to the above-described embodiments, but instead is defined by the appended claims in light of their full scope of equivalents.

What is claimed is:

1. A thermostat comprising:
   a plurality of heat-generating components;
   a plurality of first temperature sensors, each of the plurality of first temperature sensors being disposed next to a corresponding one of the plurality of heat-generating components;
   a second temperature sensor that is disposed away from the plurality of heat-generating components;
   a memory device storing a coefficient matrix; and
   one or more processors configured to perform operations comprising:
      combining a plurality of inputs to calculate an ambient temperature for an enclosure in which the thermostat is installed, the plurality of inputs comprising:
         readings from the plurality of first temperature sensors;
         readings from the second temperature sensor; and
         the coefficient matrix; and
      controlling an environmental system using the calculated ambient temperature.

2. The thermostat of claim 1, wherein the one or more processors comprise a microprocessor that executes a time-to-temperature algorithm.

3. The thermostat of claim 2, wherein the plurality of inputs further comprises a fraction of time that the microprocessor operates in a wake state.

4. The thermostat of claim 1, wherein the plurality of first temperature sensors comprises a plurality of thermistors.

5. The thermostat of claim 1, further comprising a housing, wherein the plurality of heat-generating components and the plurality of first temperature sensors are disposed inside the housing.

6. The thermostat of claim 5, wherein the housing comprises a front portion, and wherein the second temperature sensor is disposed next to the front portion of the housing.

7. The thermostat of claim 1, wherein the plurality of heat-generating components comprises a wireless communication chip.

8. A method of determining an ambient temperature in an enclosure while compensating for internal heating effects of a thermostat, the method comprising:
   operating a plurality of heat-generating components within the thermostat;
   generating readings from a plurality of first temperature sensors, each of the plurality of first temperature sensors being disposed next to a corresponding one of the plurality of heat-generating components;
generating readings from a second temperature sensor that is disposed away from the plurality of heat-generating components;
storing a coefficient matrix in a memory device;
combining a plurality of inputs to calculate an ambient temperature for an enclosure in which the thermostat is installed, the plurality of inputs comprising:
readings from the plurality of first temperature sensors;
readings from the second temperature sensor; and
the coefficient matrix; and
controlling an environmental system using the calculated ambient temperature.

9. The method of claim 8, wherein the coefficient matrix characterizes how much of each of the plurality of first temperature sensors and the second temperature sensor are weighted when calculating the ambient temperature.

10. The method of claim 8, wherein the coefficient matrix is received from a remotely located thermostat management server.

11. The method of claim 10, wherein the coefficient matrix is generated using data from thermostats from a plurality of different enclosures.

12. The method of claim 11, wherein the coefficient matrix is further generated by minimizing a mean-squared error between true ambient temperature readings calculated ambient temperature readings on a set of training data received from the thermostats from the plurality of different enclosures.

13. The method of claim 12, wherein the coefficient matrix is further generated by minimizing a quadratic total variation as a smoothness metric.

14. The method of claim 8, wherein combining a plurality of inputs to calculate an ambient temperature comprises aggregating a current contribution from the plurality of inputs with a contribution from the plurality of inputs at previous time intervals.

15. A non-transitory, computer-readable medium comprising instructions that, when executed by one-or more processors on a thermostat, cause the one or more processors to perform operations comprising:
operating a plurality of heat-generating components within the thermostat;
receiving readings from a plurality of first temperature sensors, each of the plurality of first temperature sensors being disposed next to a corresponding one of the plurality of heat-generating components;
receiving readings from a second temperature sensor that is disposed away from the plurality of heat-generating components;
storing a coefficient matrix in a memory device;
combining a plurality of inputs to calculate an ambient temperature for an enclosure in which the thermostat is installed, the plurality of inputs comprising:
readings from the plurality of first temperature sensors;
readings from the second temperature sensor; and
the coefficient matrix;
controlling an environmental system using the calculated ambient temperature.

16. The non-transitory, computer-readable medium of claim 15, wherein the plurality of heat-generating components comprises a 6LowPan wireless communication chip.

17. The non-transitory, computer-readable medium of claim 15, wherein the plurality of heat-generating components comprises a chip that powers a user interface.

18. The non-transitory, computer-readable medium of claim 15, wherein the one or more processors comprises a microprocessor that executes a time-to-temperature algorithm.

19. The non-transitory, computer-readable medium of claim 18, wherein the plurality of inputs further comprises a fraction of time that the microprocessor operates in a wake state.

20. The non-transitory, computer-readable medium of claim 18, wherein the thermostat comprises power-stealing circuitry that charges a power-storage device, the power-storage device providing power to the heat-generating components when the heat-generating components are active.

* * * * *